US007808073B2

(12) United States Patent
Wakisaka

(10) Patent No.: US 7,808,073 B2
(45) Date of Patent: Oct. 5, 2010

(54) NETWORK ELECTRONIC COMPONENT, SEMICONDUCTOR DEVICE INCORPORATING NETWORK ELECTRONIC COMPONENT, AND METHODS OF MANUFACTURING BOTH

(75) Inventor: Shinji Wakisaka, Hanno (JP)

(73) Assignee: Casio Computer Co., Ltd., Tokyo (JP)

( * ) Notice: Subject to any disclaimer, the term of this patent is extended or adjusted under 35 U.S.C. 154(b) by 565 days.

(21) Appl. No.: 11/093,571

(22) Filed: Mar. 30, 2005

(65) Prior Publication Data
US 2005/0218473 A1    Oct. 6, 2005

(30) Foreign Application Priority Data
Mar. 31, 2004 (JP) .............................. 2004-107800
Sep. 30, 2004 (JP) .............................. 2004-289081

(51) Int. Cl.
*H01L 23/52* (2006.01)
(52) U.S. Cl. ............... 257/528; 257/724; 257/E23.009; 257/E23.113; 257/E23.145
(58) Field of Classification Search ................. 257/528
See application file for complete search history.

(56) References Cited

U.S. PATENT DOCUMENTS 6,545,354 B1 * 4/2003 Aoki et al. .................. 257/734

| | | | | |
|---|---|---|---|---|
| 7,102,227 B2 * | 9/2006 | Terui | ............... | 257/724 |
| 7,161,793 B2 * | 1/2007 | Kurihara et al. | ...... | 361/306.3 |
| 7,176,556 B2 * | 2/2007 | Okamoto et al. | ......... | 257/621 |
| 7,208,832 B2 * | 4/2007 | Yamagata | .............. | 257/701 |

FOREIGN PATENT DOCUMENTS

| JP | 2000-022070 A | 1/2000 |
|---|---|---|
| JP | 2000-348914 A | 12/2000 |
| JP | 2001-217372 A | 8/2001 |
| JP | 2002-057291 A | 2/2002 |
| JP | 2002-222925 A | 8/2002 |
| JP | 2003-031756 A | 1/2003 |
| JP | 2003-142590 A | 5/2003 |
| JP | 2003-298005 A | 10/2003 |
| JP | 2004-071998 A | 3/2004 |
| JP | 2004-095638 A | 3/2004 |
| JP | 2004-186497 A | 7/2004 |

OTHER PUBLICATIONS

Japanese Office Action (and Engish language translation thereof) dated Dec. 25, 2007, issued in a counterpart Japanese Application.

* cited by examiner

*Primary Examiner*—Jerome Jackson, Jr.
(74) *Attorney, Agent, or Firm*—Holtz, Holtz, Goodman & Chick, PC

(57) ABSTRACT

A network electronic component comprises a network-electronic-component substrate, a thin-film passive element provided on the substrate, and a plurality of external connection electrodes provided on the substrate in connection with the thin-film passive element.

12 Claims, 31 Drawing Sheets

NETWORK ELECTRONIC COMPONENT, SEMICONDUCTOR DEVICE INCORPORATING NETWORK ELECTRONIC COMPONENT, AND METHODS OF MANUFACTURING BOTH

BACKGROUND OF THE INVENTION

1. Field of the Invention

The present invention relates to a network electronic component, a semiconductor device incorporating network electronic component, and methods of manufacturing them.

2. Description of the Related Art

There are network electronic components each of which has a plurality of resistive elements or dielectrics integrated on a single insulating substrate to constitute a composite circuit network. Although simple successive formation of resistive elements or dielectrics without forming a circuit network may be called an electronic component array, the term "network electronic component" is used in the specification to include such an electronic component array. Unexamined Japanese Patent Application KOKAI Publication No. 2000-348914 describes one example of such a network electronic component. The network electronic component described in the publication has a plurality of grooves provided on both sides of a ceramic substrate, and plural pairs of upper electrodes provided on the top side of the ceramic substrate at those portions which do not correspond to the grooves. Plural pairs of lower electrodes are provided on the bottom side of the ceramic substrate at those portions which do not correspond to the grooves, and plural pairs of side electrodes are provided on both sides of the ceramic substrate at those portions which do not correspond to the grooves. A thin-film resistor is provided between each pair of upper electrodes, and a protection glass layer, an intermediate glass layer and a coating glass layer are provided on a ceramic substrate including the thin-film resistor, etc. Nickel or solder is plated on the top surface of the electrode portion which comprises the upper electrode, the lower electrode and the side electrode exposed in that state.

In manufacturing the network electronic component with the structure, first, first break grooves and second break grooves are formed in a lattice pattern on the top side of an aggregate ceramic substrate having an area large enough to form a plurality of completed network electronic components, and through holes for the formation of side grooves are formed in the aggregate ceramic substrate on the first brake grooves. Next, an electrode paste is printed on the top side of the aggregate ceramic substrate to form upper electrodes, and an electrode paste is printed on the bottom side of the aggregate ceramic substrate to form lower electrodes. A resistor paste is printed between a pair of upper electrodes to form a thin-film resistor, a protection glass layer for protecting the thin-film resistor is formed by printing, and an intermediate glass layer and a coating glass layer are formed by printing. The aggregate ceramic substrate is diced along the first brake grooves to split the ceramic substrate into a plurality of unit ceramic substrates. Then, nickel or solder is plated on the top surface of the electrode portion which comprises the upper electrode, the lower electrode and the side electrode of each unit ceramic substrate.

According to the network electronic component with the structure, however, as the electrode portion comprises upper electrodes provided on the top side of the ceramic substrate at those portions which do not correspond to the grooves, lower electrodes provided on the bottom side of the ceramic substrate at those portions which do not correspond to the grooves, and side electrodes provided on both sides of the ceramic substrate at those portions which do not correspond to the grooves, the structure is complex. In addition, the manufacturing process involves a significant large number of steps and is thus troublesome. For example, the manufacturing process comprises a first brake groove and second break groove forming step, a through hole forming step, an upper electrode forming step, a lower electrode forming step, a thin-film resistor forming step, a protection glass layer forming step, an intermediate glass layer and coating glass layer forming step, a first brake groove dicing step, a side electrode forming step, a second brake groove dicing step, and a nickel plating and solder plating step. What is more, the side electrode forming step follows the first brake groove dicing step, and the nickel plating and solder plating step follows the second brake groove dicing step, thus making the manufacturing process extremely complicated.

SUMMARY OF THE INVENTION

Accordingly, it is an object of the invention to provide a network electronic component which has a simple structure and ensures simplification of the manufacturing process.

A network electronic component according to the invention comprises a substrate; a thin-film passive element provided on the substrate; and a plurality of external connection electrodes provided on the substrate in connection with the thin-film passive element.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Figure 1:
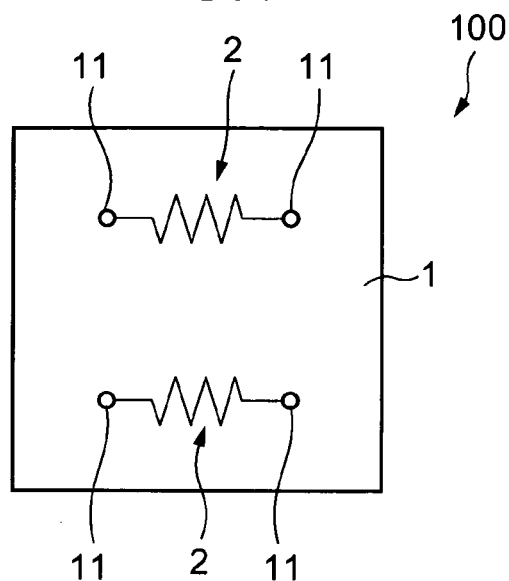
FIG. 1 is a plan view showing an equivalent circuit of a network electronic component according to a first embodiment of the invention.

FIG. 1 shows a plan view of the equivalent circuit of a network electronic component 100 according to the first embodiment of the invention. The network electronic component 100 has two thin-film resistive elements 2 provided, isolated from each other, on a silicon substrate (semiconductor substrate) 1 having a square shape in a plan view. Both end portions of the thin-film resistive element 2 are connected to external connection electrodes each comprised of a columnar electrode 11 to be discussed later.

Figure 2:
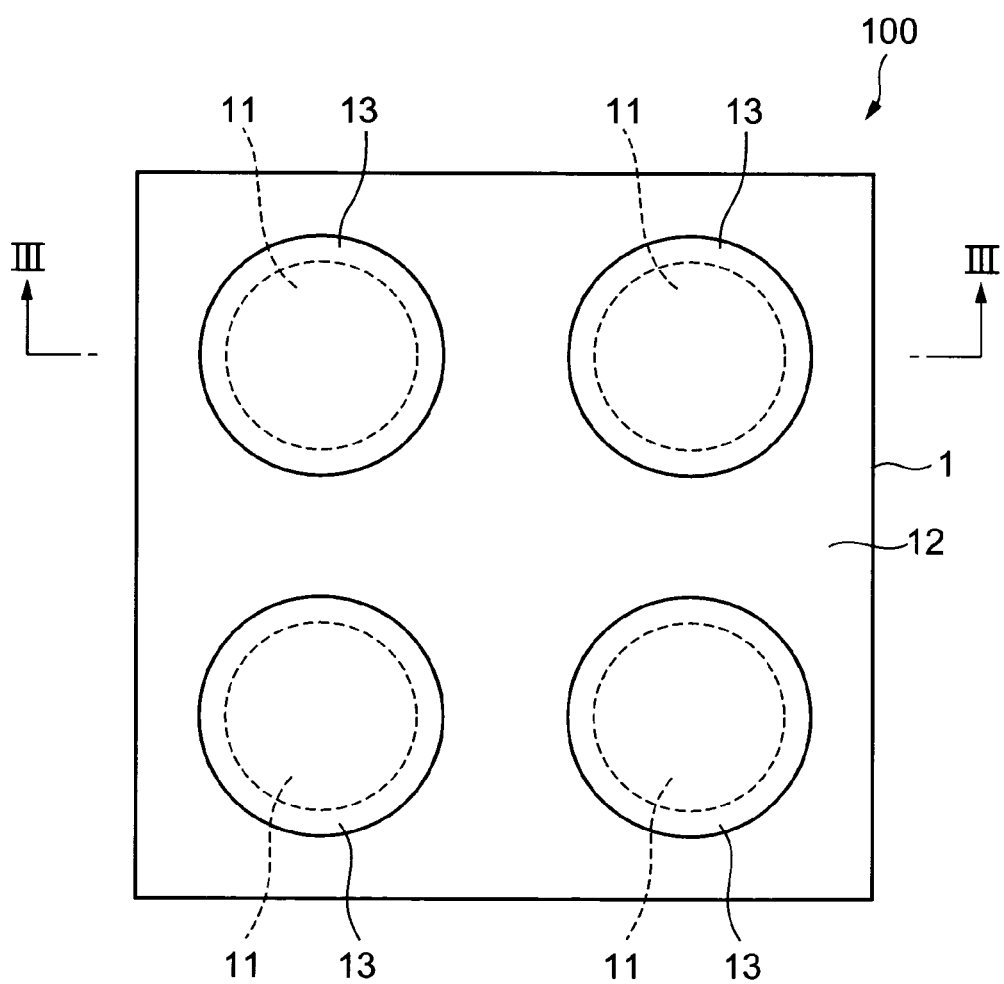
FIG. 2 is a plan view of the network electronic component shown in FIG. 1.
Figure 3:
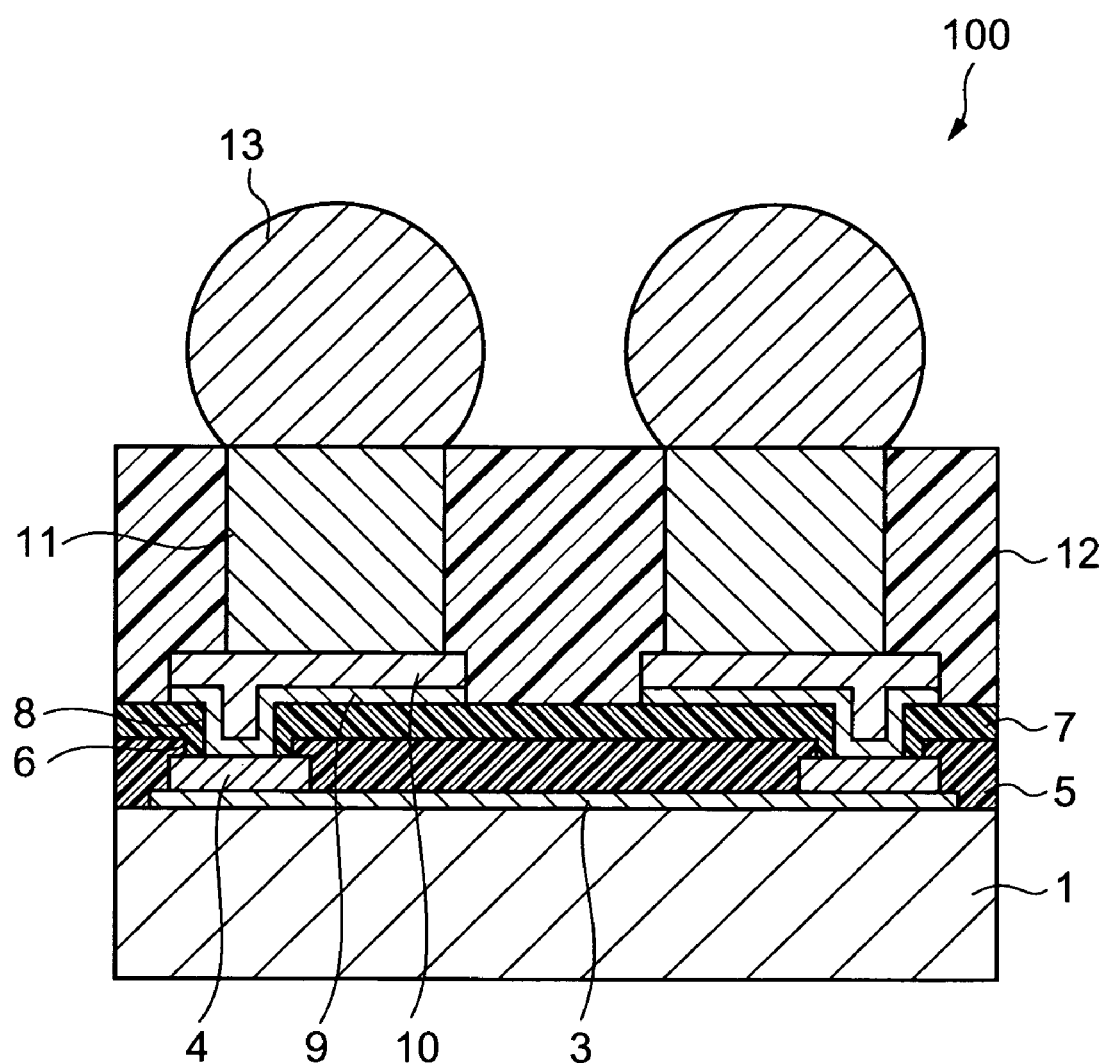
FIG. 3 is a cross-sectional view along line III-III in FIG. 2.

FIG. 2 shows a plan view of the network electronic component 100 shown in FIG. 1, and FIG. 3 shows a cross section along line III-III in FIG. 2. Referring to FIG. 3, a strip-like thin-film resistor (thin-film passive element) 3 of NiCr, TaN or the like is provided on the silicon substrate 1. A plurality of connection pads 4 (external connection electrodes) of an aluminum-based metal or the like is provided on the top surfaces of both end portions of the thin-film resistor 3. An insulating film 5 of silicon oxide or the like is provided on the top surfaces of the thin-film resistor 3 and the silicon substrate 1 excluding the center portions of the connection pads 4, which are exposed through openings 6 provided in the insulating film 5.

A protection film (insulating film) 7 of a polyimide resin, an epoxy resin or the like is provided on the top surface of the insulating film 5. An opening 8 is provided on the protection film 7 at that portion of the insulating film 5 which corresponds to the opening 6. A base metal layer 9 of copper or the like is provided on the top surface of the protection film 7. Wirings 10 of copper are provided on the on the entire top side of the base metal layer 9. One end of the wiring 10 including the base metal layer 9 is connected to the connection pad 4 via both openings 6 and 8.

A columnar electrode 11 of copper is provided on that top surface of the wiring 10 which corresponds to the connection pad 4. A sealing film 12 of an epoxy resin, a polyimide resin or the like is provided on the top surfaces of the wiring 10 and the protection film 7, with its top surface being in flush with the top surface of the columnar electrode 11. A solder ball 13 is provided on the at the top surface of the columnar electrode 11.

As shown in FIG. 1, the two thin-film resistive elements 2 are provided, isolated from each other, on the silicon substrate 1 with a square shape in a plan view., and the four external connection electrodes or the columnar electrodes 11 are laid out in two rows by two columns. As shown in FIG. 2, therefore, the columnar electrodes 11 and the solder balls 13 are likewise laid out in two rows by two columns. One example of the sizes of a part of the network electronic component will be discussed below. The silicon substrate 1 has a size of 1.0 mm×1.0 mm, the columnar electrodes 11 have a pitch of 0.5 mm and a diameter of 0.25 mm.

Figure 4:
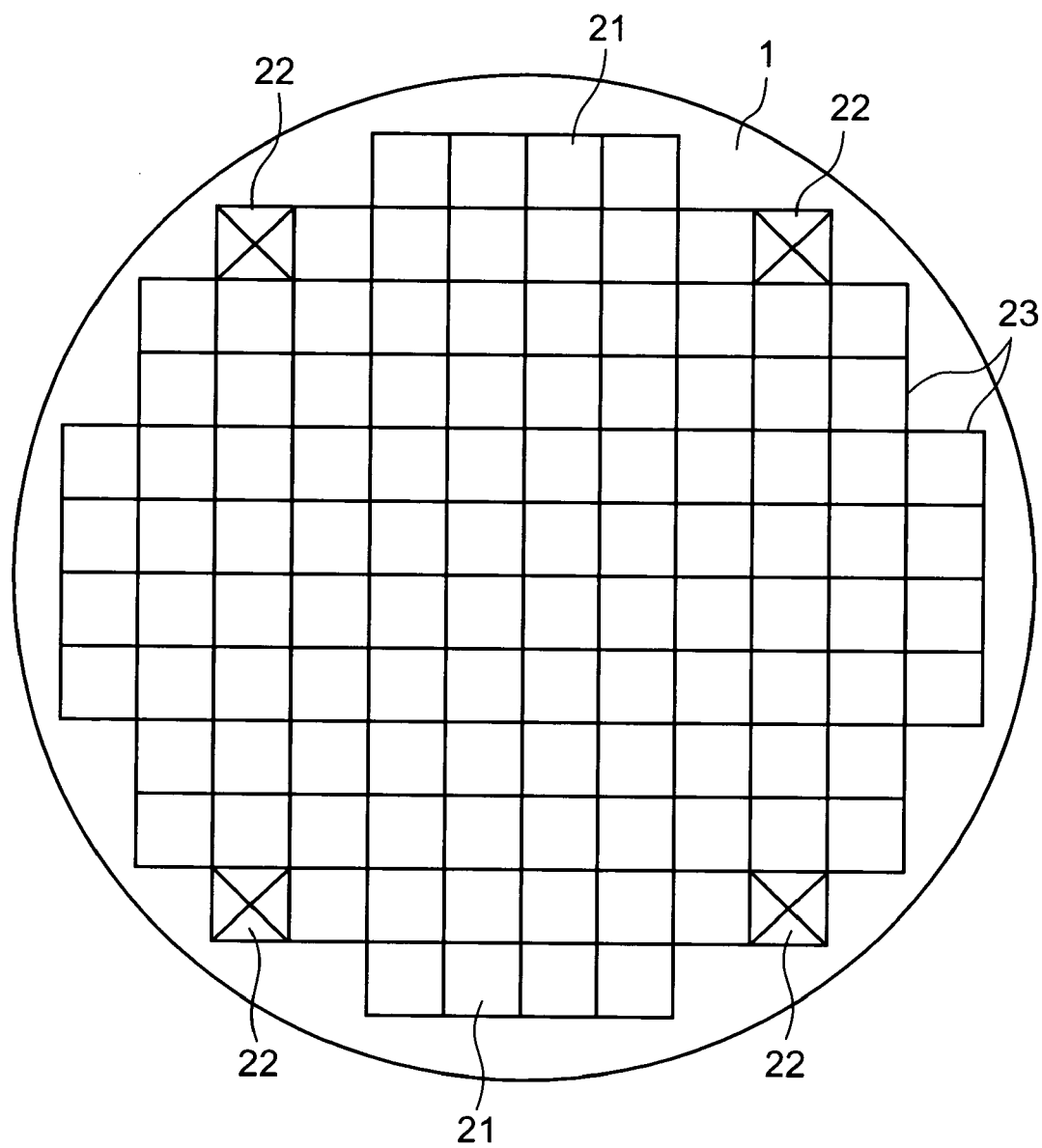
FIG. 4 is a plan view of a wafered silicon substrate initially prepared at the time of manufacturing the network electronic component shown in FIGS. 1 to 3.

One example of the method of manufacturing the network electronic component 100 will be discussed next. First, the wafered silicon substrate (semiconductor substrate) 1 is prepared as shown in FIG. 4. In FIG. 4, no marked square regions surrounded by vertical lines and horizontal lines are network-electronic-component forming regions 21, and regions marked with "X" are alignment-mark forming regions 22. Therefore, the vertical lines and horizontal lines are dicing streets 23. It is to be noted that the dicing street 23 is an imaginary line in design, not a real line formed on the top side of the silicon substrate 1.

Figure 5:
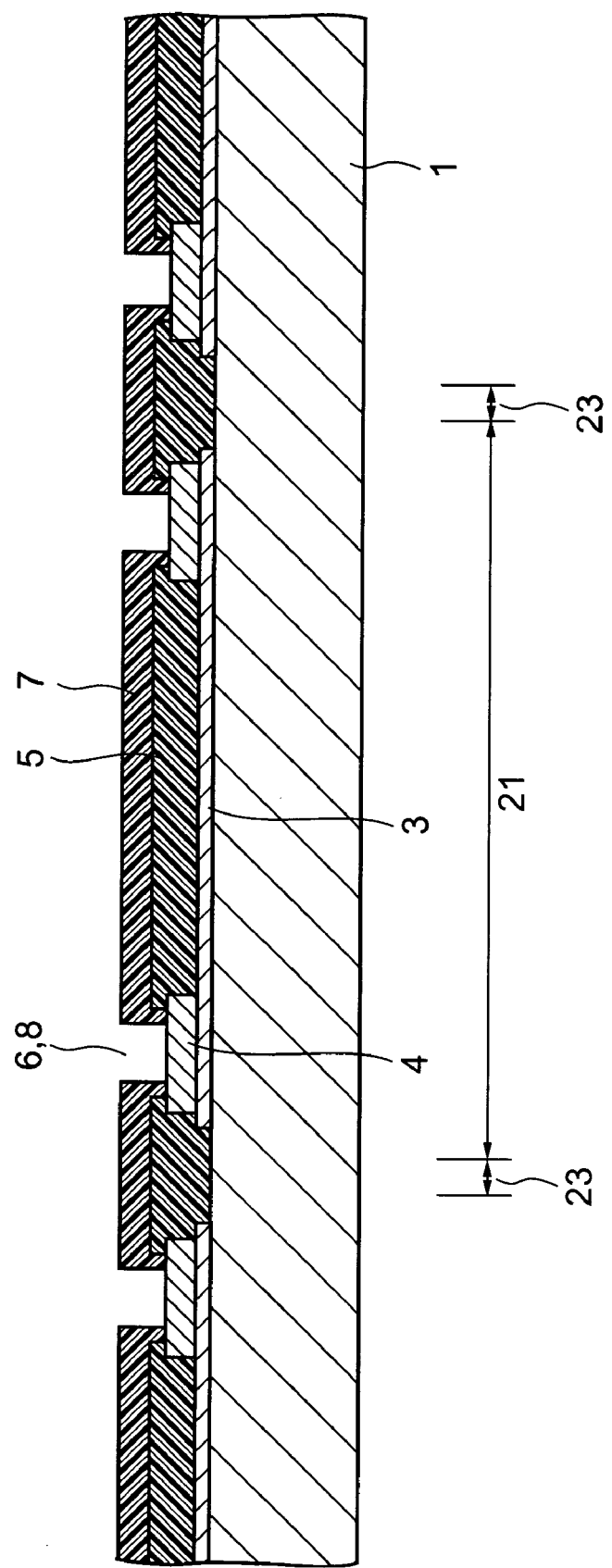
FIG. 5 is a cross-sectional view of a step following the step in FIG. 4.

Next, as shown in FIG. 5, the strip-like thin-film resistors 3 of NiCr, TaN or the like are formed on the top side of the silicon substrate 1 by printing and annealing. In this state, two thin-film resistors 3 are formed in parallel to each other on one square network-electronic-component forming region 21 on the top side of the silicon substrate 1. Then, the connection pads 4 of an aluminum-based metal or the like is formed on the top surfaces of both end portions of the thin-film resistor 3.

Next, the insulating film 5 of silicon oxide or the like is formed on the entire top side of the silicon substrate 1 including the thin-film resistor 3 and the connection pad 4. Then, the opening 6 is formed in that portion of the insulating film 5 which corresponds to the center portion of the connection pad 4. Then, the protection film 7 of a polyimide resin, an epoxy resin or the like is formed on the entire top side of the insulating film 5 including inside the opening 6. Then, the opening 8 is formed in that portion of the protection film 7 which corresponds to the opening 6 in the insulating film 5.

Figure 6:
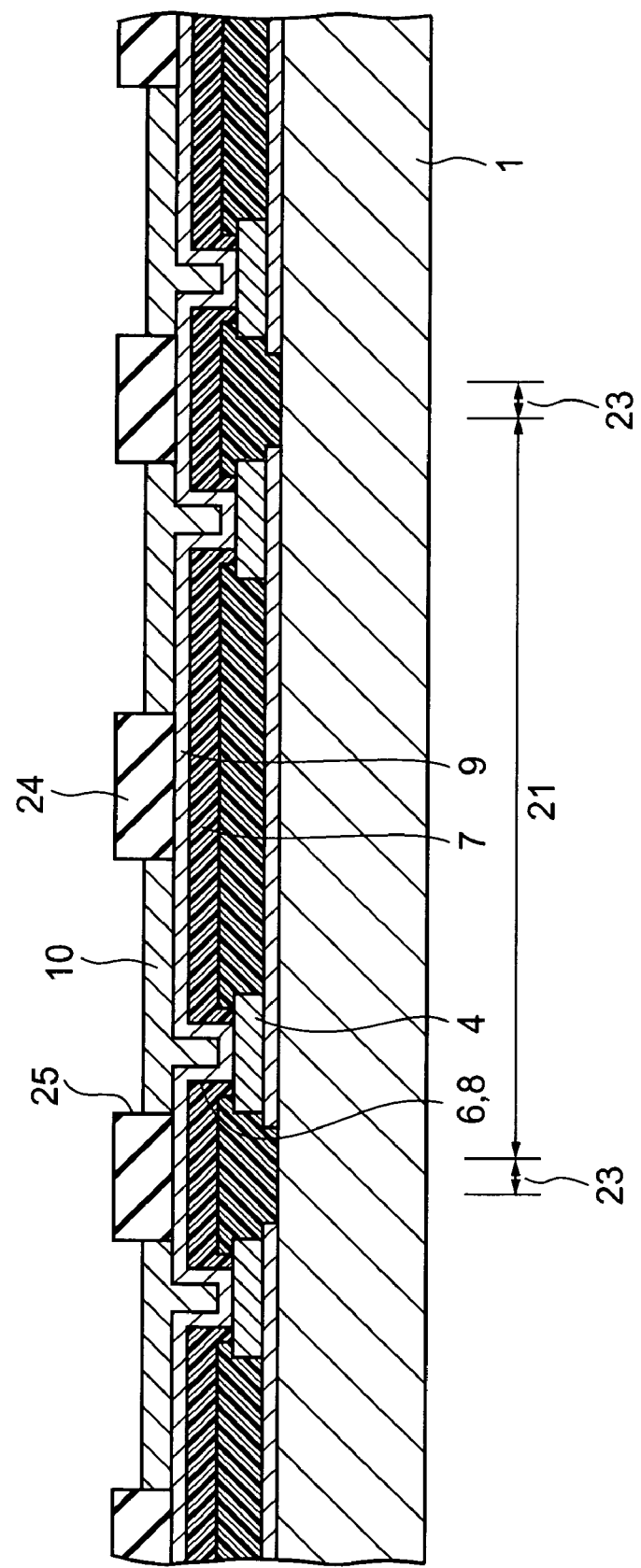
FIG. 6 is a cross-sectional view of a step following the step in FIG. 5.

Next, as shown in FIG. 6, the base metal layer 9 is formed on the entire top side of the protection film 7 including the top side of the connection pad 4 exposed through both openings 6 and 8. The base metal layer 9 may be a copper layer formed by electroless plating, or may be a copper layer formed by sputtering. Alternatively, the base metal layer 9 may be a copper layer formed by sputtering on a thin layer of titanium or the like formed by sputtering.

Then, a plated resist film 24 is patterned on the top side of the base metal layer 9. An opening 25 is formed at that portion of the plated resist film 24 which corresponds to a region reserved for formation of the wiring 10. Next, electroless plating of copper is performed with the base metal layer 9 taken as a plating current path, thereby forming the wiring 10 on the top side of the base metal layer 9 in the opening 25 of the plated resist film 24. Then, the plated resist film 24 is removed.

Figure 7:
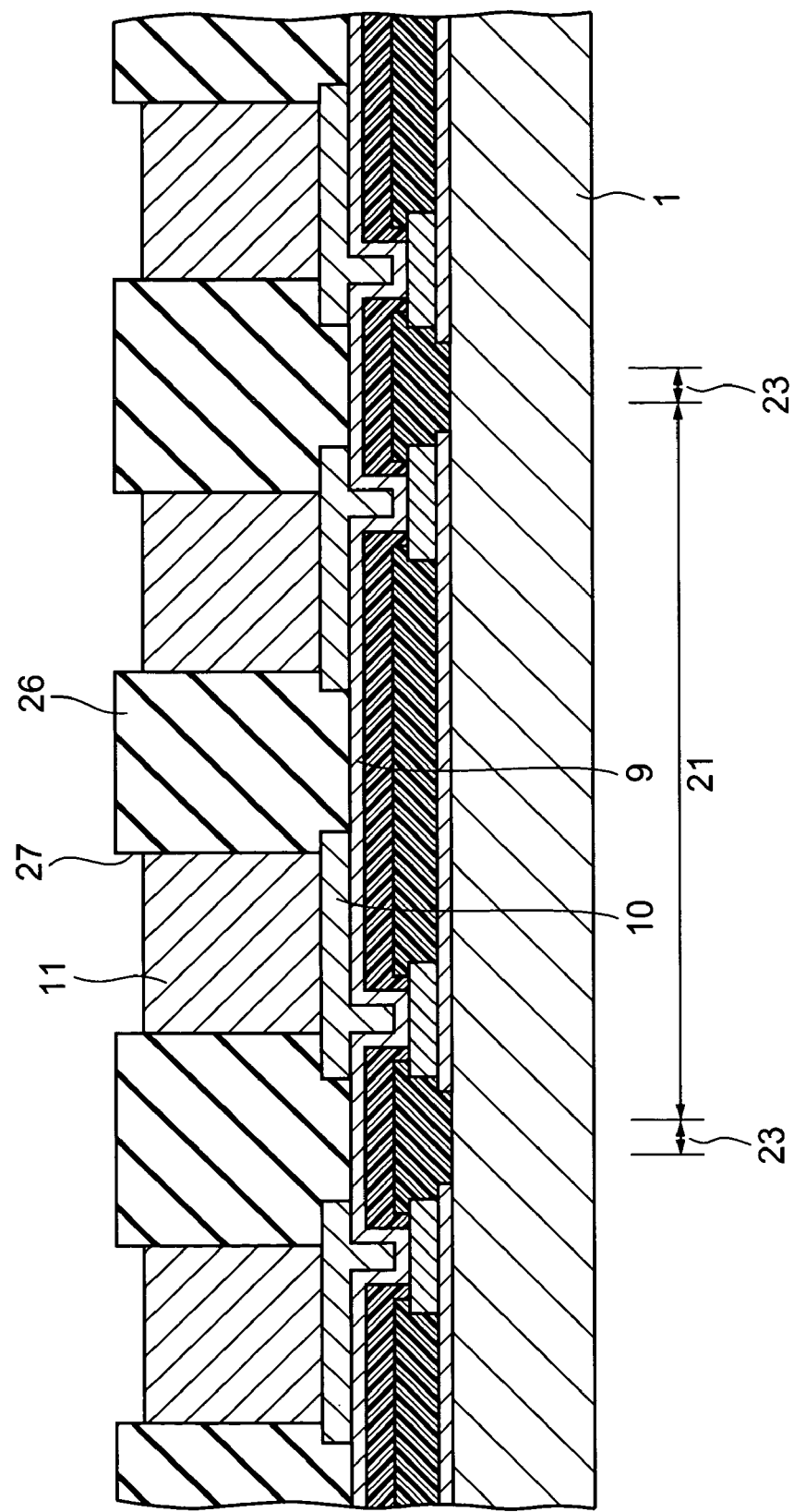
FIG. 7 is a cross-sectional view of a step following the step in FIG. 6.
Figure 8:
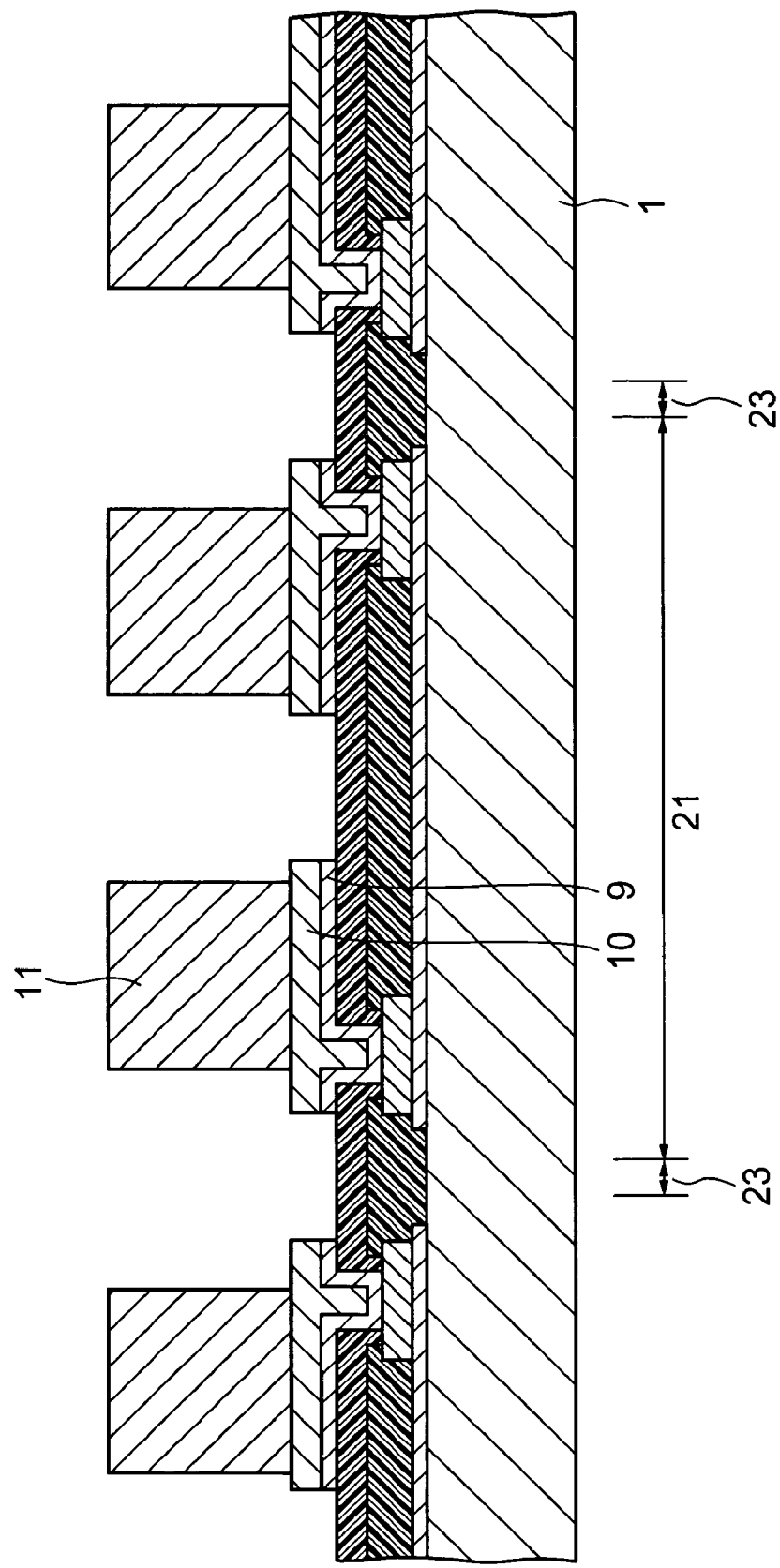
FIG. 8 is a cross-sectional view of a step following the step in FIG. 7.

Next, as shown in FIG. 7, a plated resist film 26 is patterned on the top sides of the wiring 10 and the base metal layer 9. An opening 27 is formed at that portion of the plated resist film 26 which corresponds to a region reserved for formation of the columnar electrode 11. Next, electroless plating of copper is performed with the base metal layer 9 taken as a plating current path, thereby forming the columnar electrode 11 on the top side of the connection pad of the wiring 10 in the opening 27 of the plated resist film 26. Then, the plated resist film 26 is removed. Then, with the wiring 10 as a mask, unnecessary portions of the base metal layer 9 are etched off, leaving the base metal layer 9 only under the wiring 10 as shown in FIG. 8.

Figure 9:
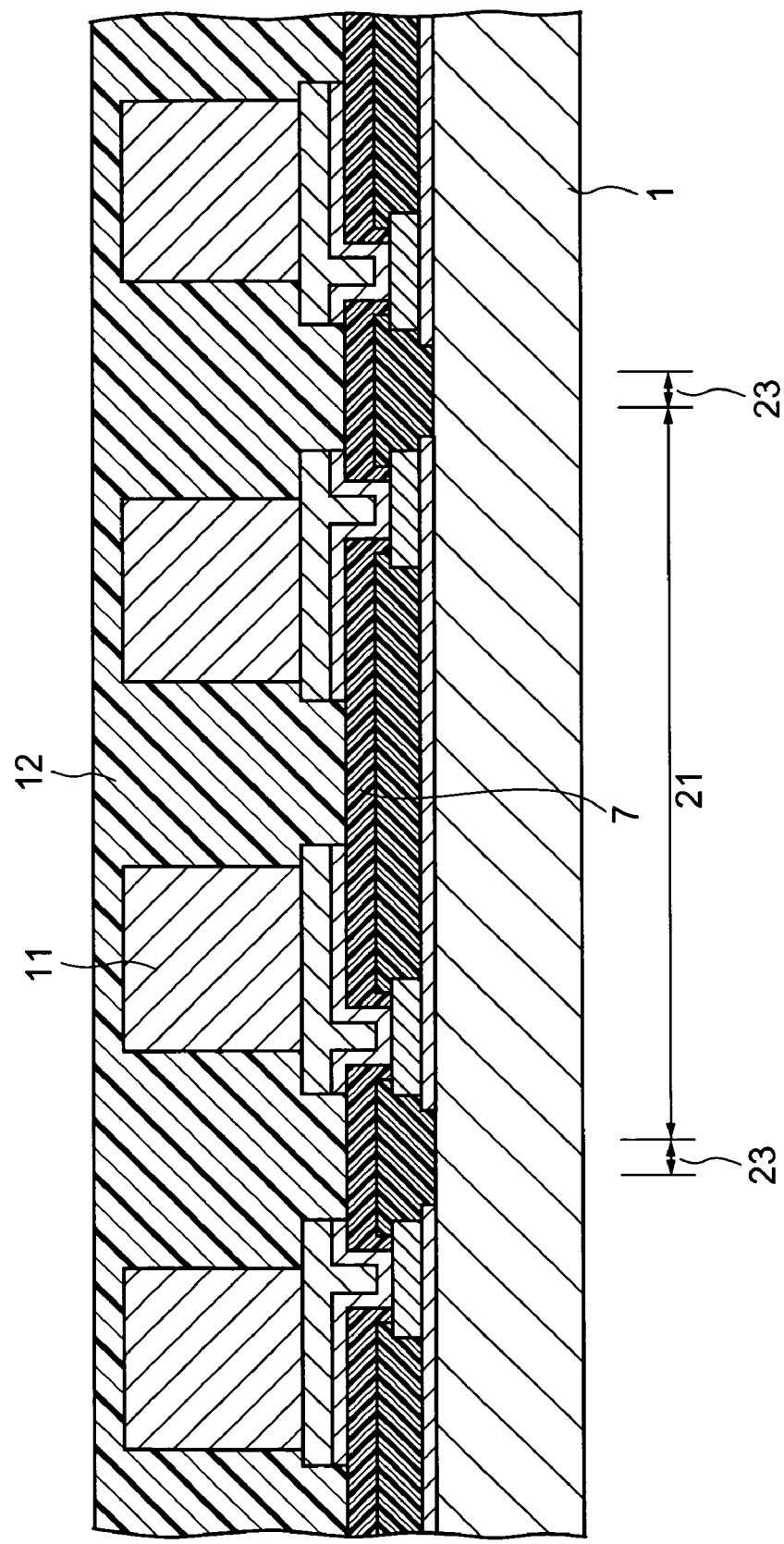
FIG. 9 is a cross-sectional view of a step following the step in FIG. 8.

Next, by using screen printing, spin coating, diecoating or the like, the sealing film 12 of an epoxy resin, polyimide resin or the like is formed on the entire top side of the protection film 7 including the columnar electrode 11 and the wiring 10 in such a way that the thickness of the sealing film 12 becomes greater than the height of the columnar electrode 11, as shown in FIG. 9. In this state, therefore, the top side of the columnar electrode 11 is covered with the sealing film 12.

Figure 10:
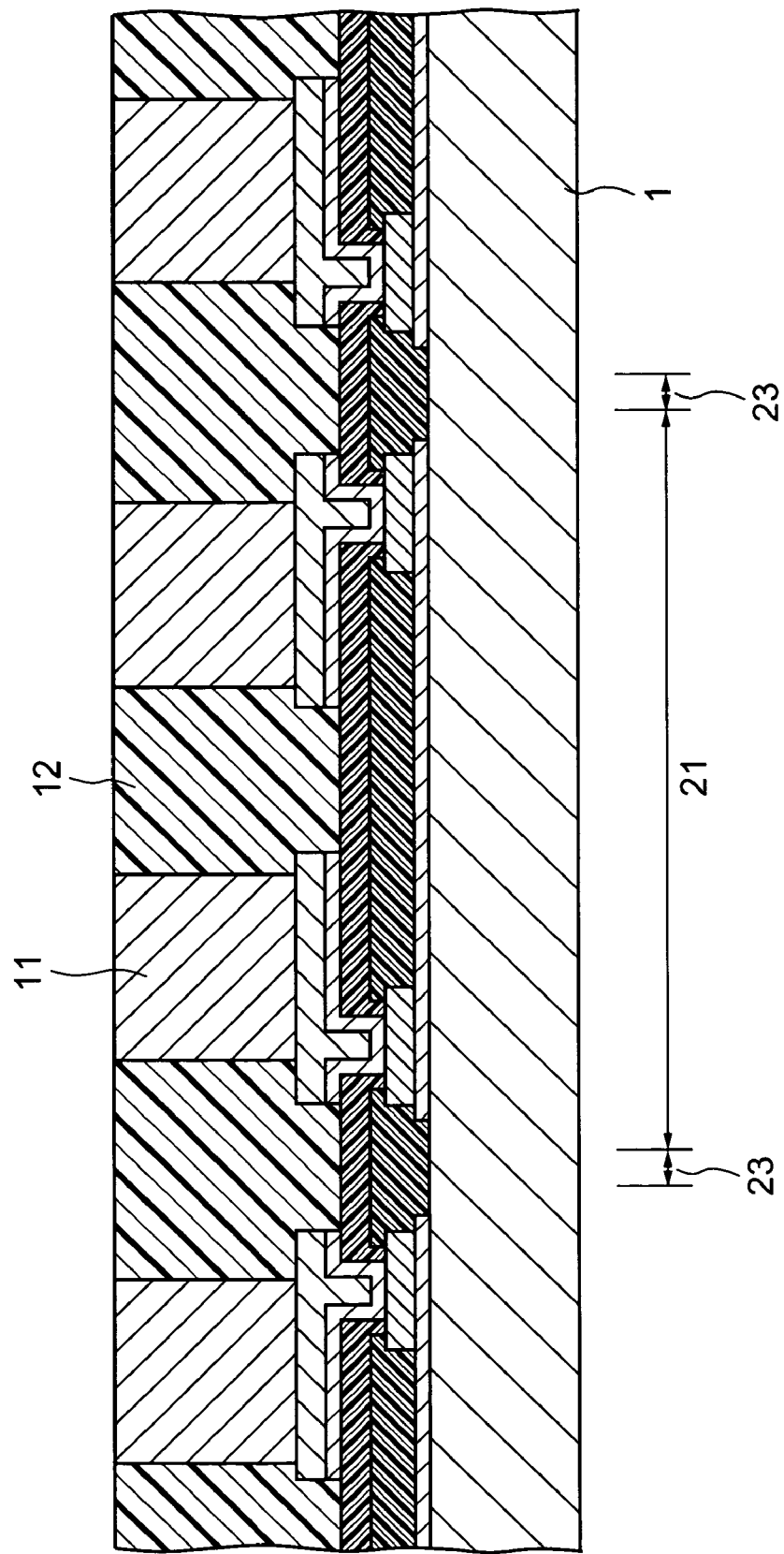
FIG. 10 is a cross-sectional view of a step following the step in FIG. 9.

Next, the top surface of the sealing film 12 is adequately polished, exposing the top side of the columnar electrode 11 as shown in FIG. 10, and the top side of the sealing film 12 and the exposed top side of the columnar electrode 11 is planarized. The adequate polishing of the top surface side of the columnar electrode 11 is carried out to cancel a possible variation in the height of the columnar electrodes 11 formed by electroless plating and make the heights of the columnar electrodes 11 uniform.

Figure 11:
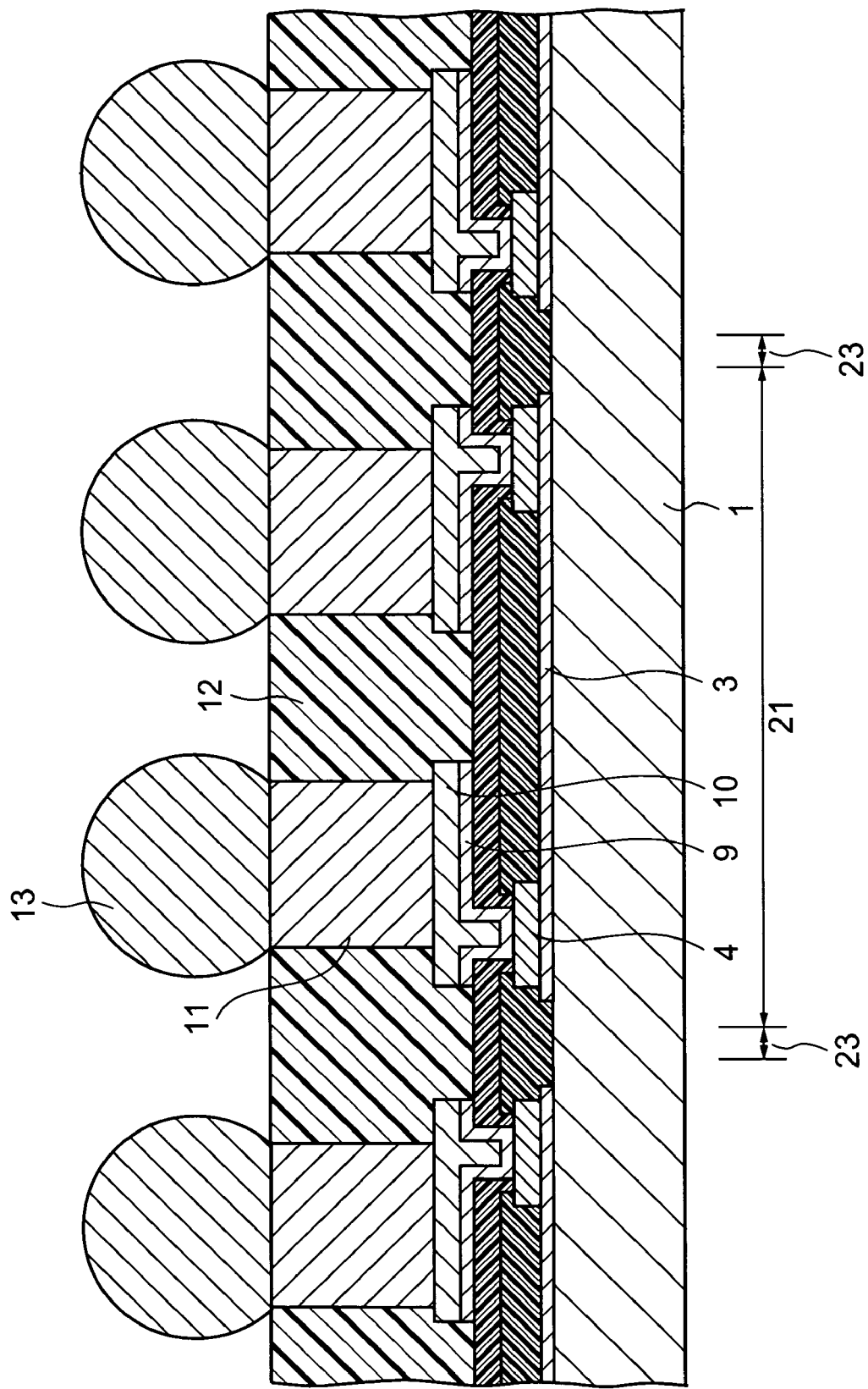
FIG. 11 is a cross-sectional view of a step following the step in FIG. 10.
Figure 12:
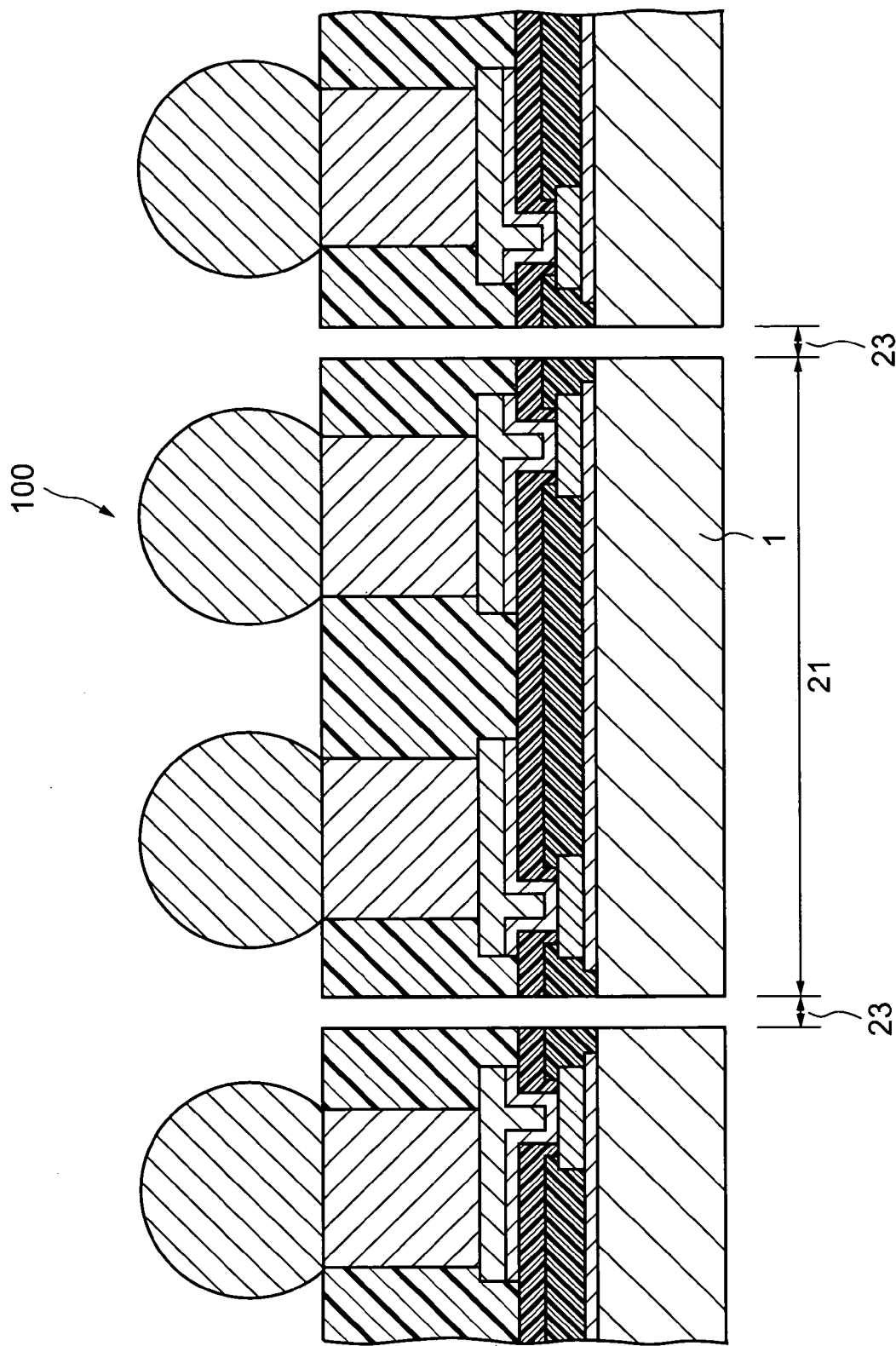
FIG. 12 is a cross-sectional view of a step following the step in FIG. 11.

Next, the solder ball 13 is formed on the columnar electrode 11 as shown in FIG. 11. Then, the bottom side of the silicon substrate 1 is adhered to a dicing tape (not shown), and the silicon substrate 1 is diced along the dicing streets 23 with alignment marks (not shown) formed at the alignment-mark forming regions 22 shown in FIG. 4 taken as a reference, and is separated from the dicing tape, yielding a plurality of network electronic components shown in FIG. 2.

Because the columnar electrodes 11 as the external connection electrodes are provided on the silicon substrate 1, the network electronic component acquired this way has a simple structure. In addition, the manufacturing method forms the thin-film resistors 3, the connection pads 4, the wirings 10, the columnar electrodes 11 and the solder balls 13 at a time with respect to a plurality of network-electronic-component forming regions 21 on the wafered silicon substrate 1 and then dices the silicon substrate 1 along the dicing streets 23 to provide a plurality of network electronic components, thereby simplifying the manufacturing process.

Second Embodiment

Figure 13:
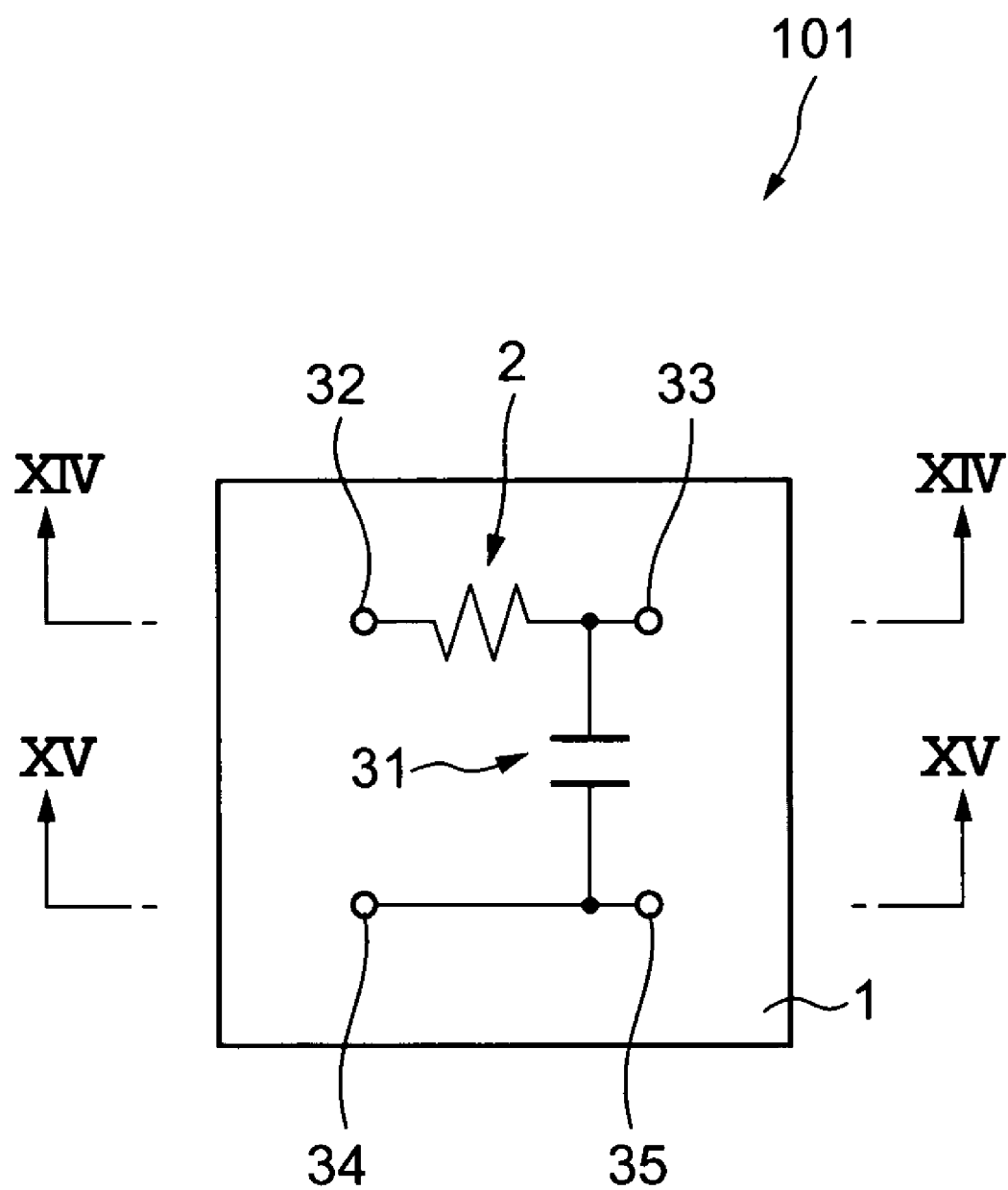
FIG. 13 is a plan view showing an equivalent circuit of a network electronic component according to a second embodiment of the invention.

FIG. 13 is a plan view showing the equivalent circuit of a network electronic component 101 according to the second embodiment of the invention. In the network electronic component 101, an RC element (low-pass filter) comprising a single thin-film resistive element 2 and a single thin-film capacitive element (thin-film passive element) 31 is provided on the silicon substrate 1 having a square shape in a plan view. Both end portions of the thin-film resistive element 2 are connected to input-side and output-side external connection electrodes 32 and 33 each comprised of a columnar electrode. One end of the thin-film capacitive element 31 is connected to the output side of the thin-film resistive element 2, while the other end is connected to input-side and output-side external connection electrodes 34 and 35 each comprised of a columnar electrode.

Figure 14:
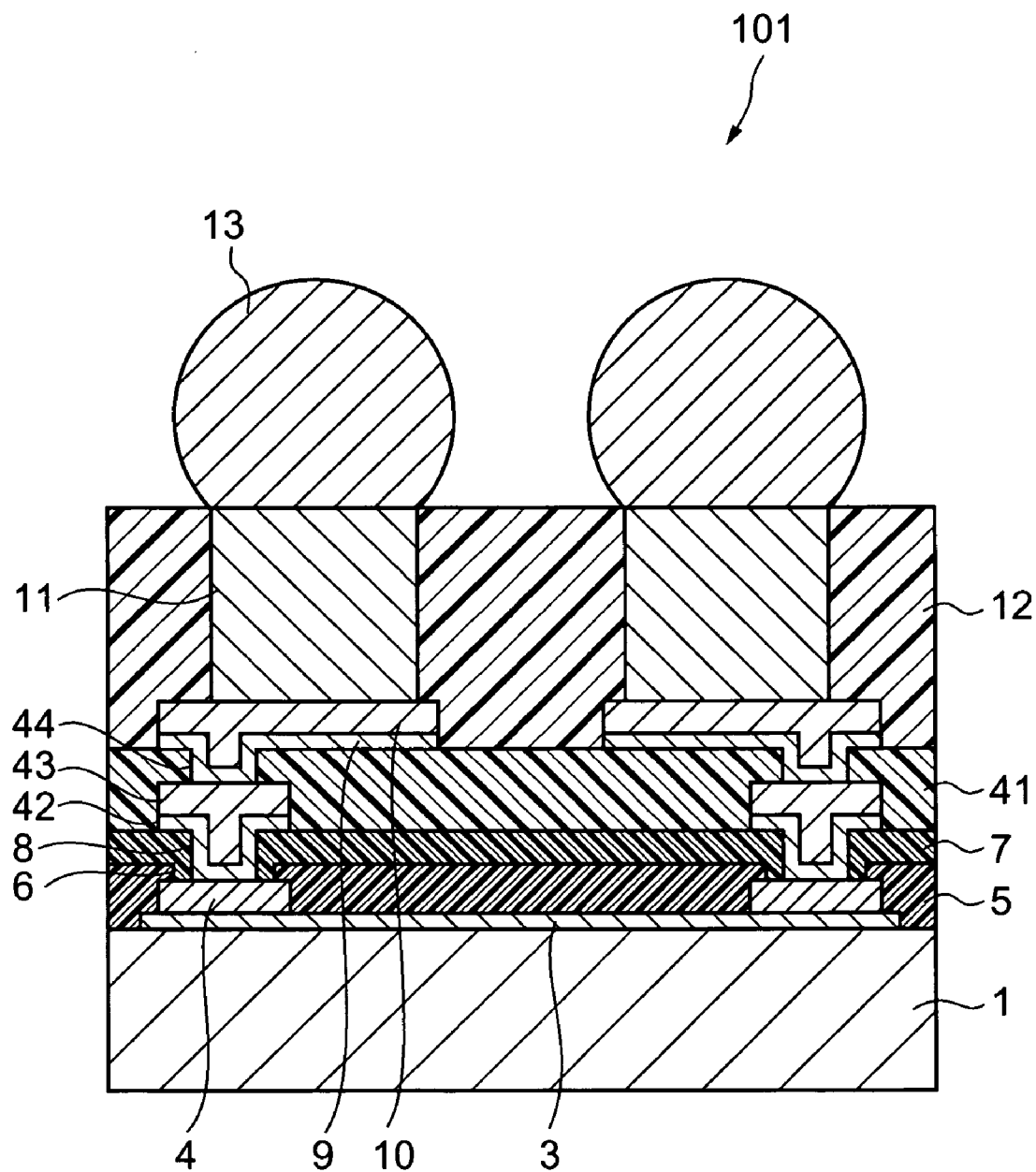
FIG. 14 is a cross-sectional view along line XIV-XIV in FIG. 13.

Next, the thin-film resistive element 2 shown in FIG. 13 will be described referring to FIG. 14 which is a cross-sectional view along line XIV-XIV in FIG. 13. The network electronic component 01 shown in FIG. 14 differs from the network electronic component 100 shown in FIG. 3 in that an interlayer insulating film 41 of an epoxy resin, polyimide resin or the like is provided between the protection film 7 and the sealing film 12, an intermediate wiring 43 of copper including a base metal layer 42 of copper or the like provided on the top side of the protection film 7 is connected to the columnar electrodes 4 via the openings 6 and 8 in the insulating film 5 and the protection film 7, and the wiring 10 including the base metal layer 9 provided on the top side of the interlayer insulating film 41 is connected to the intermediate wiring 43 via an opening 44 provided in the interlayer insulating film 41.

Figure 15:
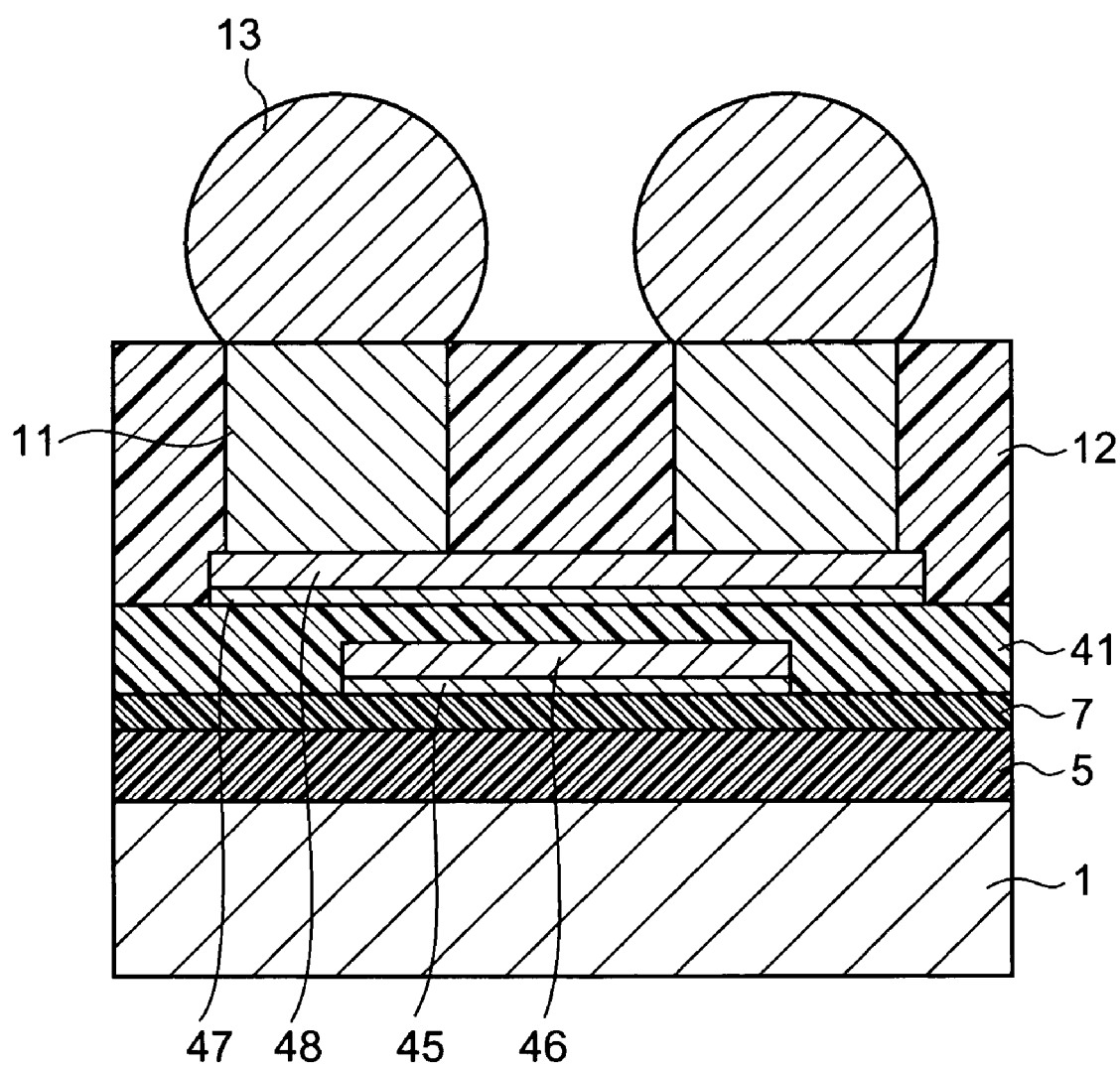
FIG. 15 is a cross-sectional view along line XV-XV in FIG. 13.

Next, the thin-film capacitive element 31 shown in FIG. 13 will be described referring to FIG. 15 which is a cross-sectional view along line XV-XV in FIG. 13. A base metal layer 45 of copper or the like and a lower conductive layer 46 of copper are provided on the top side of the protection film 7. The base metal layer 45 and the lower conductive layer 46 are connected to the base metal layer 42 and the intermediate wiring 43 shown in FIG. 14 by lead-out wires (not shown). A base metal layer 47 of copper or the like and an upper conductive layer 48 of copper are provided on the top side of the interlayer insulating film 41.

The upper conductive layer 48 is formed in such a way as to face the lower conductive layer 46 with the interlayer insulating film 41 in between. And the upper conductive layer 48, the interlayer insulating film 41, and the lower conductive layer 46 constitute the thin-film capacitive element 31. The upper conductive layer 48 has two connection pads on whose top sides the columnar electrodes 11 are provided. The sealing film 12 is provided on the top side of the interlayer insulating film 41 including the upper conductive layer 48 in such a way that the top side of the sealing film 12 is in flush with the top side of each columnar electrode 11. The solder ball 13 is provided on the top side of the columnar electrode 11.

Because the columnar electrodes 11 as the external connection electrodes are provided only on the silicon substrate 1, the network electronic component has a simple structure. In manufacturing the network electronic component, the thin-film resistors 3, the connection pads 4, the intermediate wirings 43, the lower conductive layers 46, the wirings 10, the upper conductive layers 48, the columnar electrodes 11 and the solder balls 13 are formed simultaneously at a time with respect to a plurality of network-electronic-component forming regions on the silicon substrate 1, then the silicon substrate 1 is diced to provide a plurality of network electronic components, as per the first embodiment. This can make the manufacturing process simple.

Third Embodiment

Figure 16:
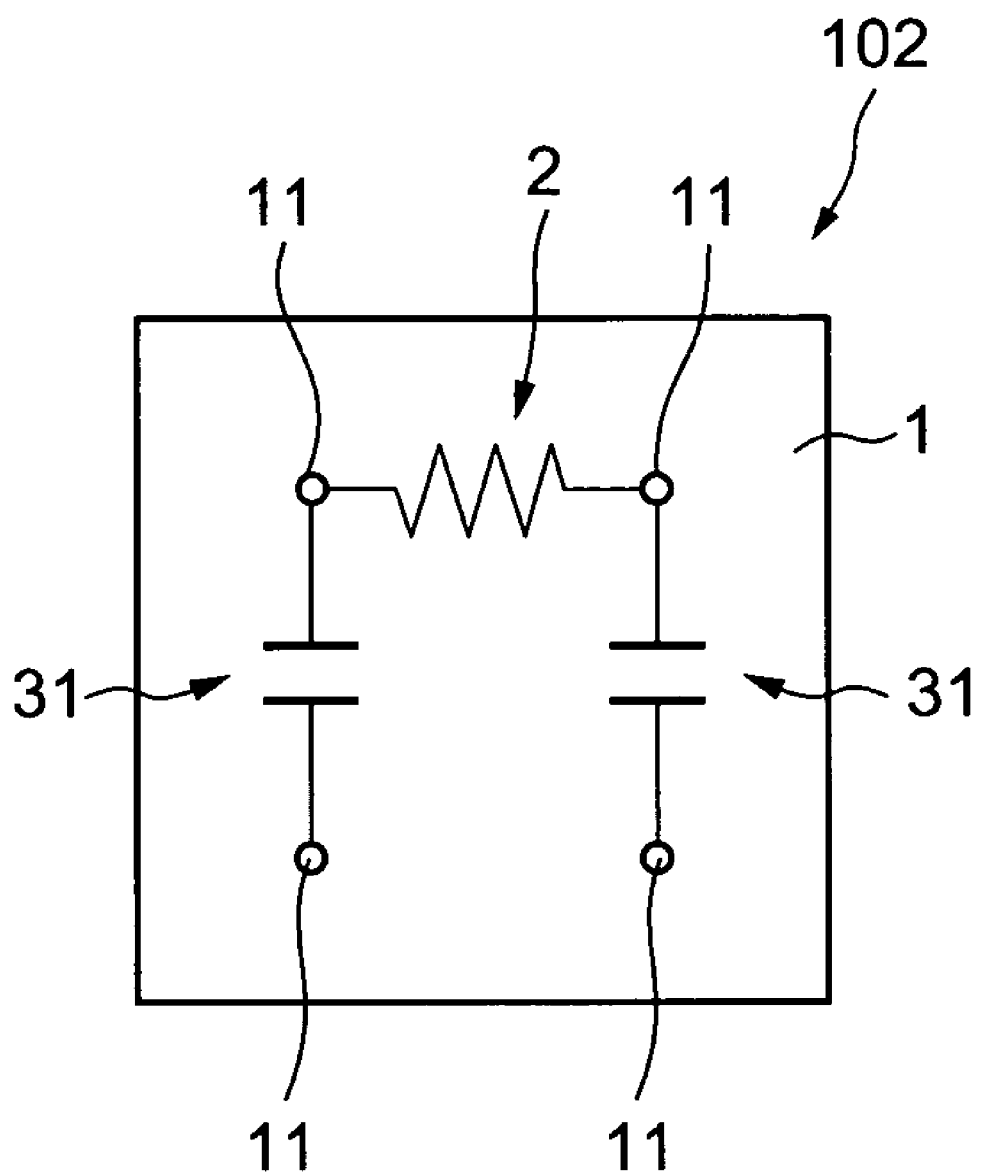
FIG. 16 is a plan view showing an equivalent circuit of a network electronic component according to a third embodiment of the invention.

FIG. 16 is a plan view showing the equivalent circuit of a network electronic component 102 according to the third embodiment of the invention. In the network electronic component 102, a single thin-film resistive element 2 and two thin-film capacitive elements 31 are provided on the silicon substrate 1. Both end portions of the thin-film resistive element 2 are connected to external connection electrodes comprised of two upper columnar electrodes 11. Both end portions of one of the thin-film capacitive elements 31 are connected to external connection electrodes comprised of two left-hand columnar electrodes 11. Both end portions of the other thin-film capacitive element 31 are connected to external connection electrodes comprised of two right-hand columnar electrodes 11.

Fourth Embodiment

Figure 17:
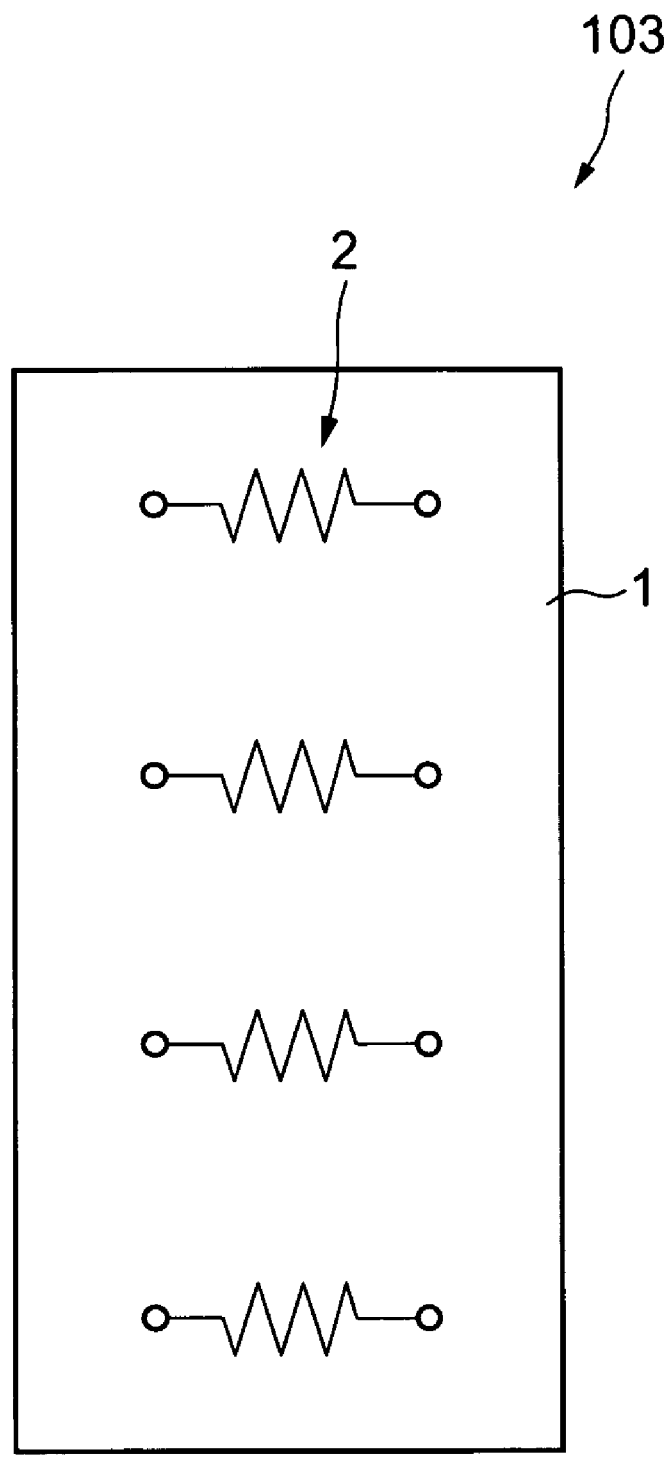
FIG. 17 is a plan view showing an equivalent circuit of a network electronic component according to a fourth embodiment of the invention.

FIG. 17 is a plan view showing the equivalent circuit of a network electronic component 103 according to the fourth embodiment of the invention. The network electronic component 103 differs from the network electronic component 100 of the first embodiment in that the network electronic component 103 has four thin-film resistive elements 2 having a quadratic shape in a plan view. The network electronic component 103 is acquired by, for example, dicing the silicon substrate 1 along all the vertical lines of dicing streets 23 shown in FIG. 4 and along every other horizontal lines of the dicing streets 23.

Fifth Embodiment

Figure 18:
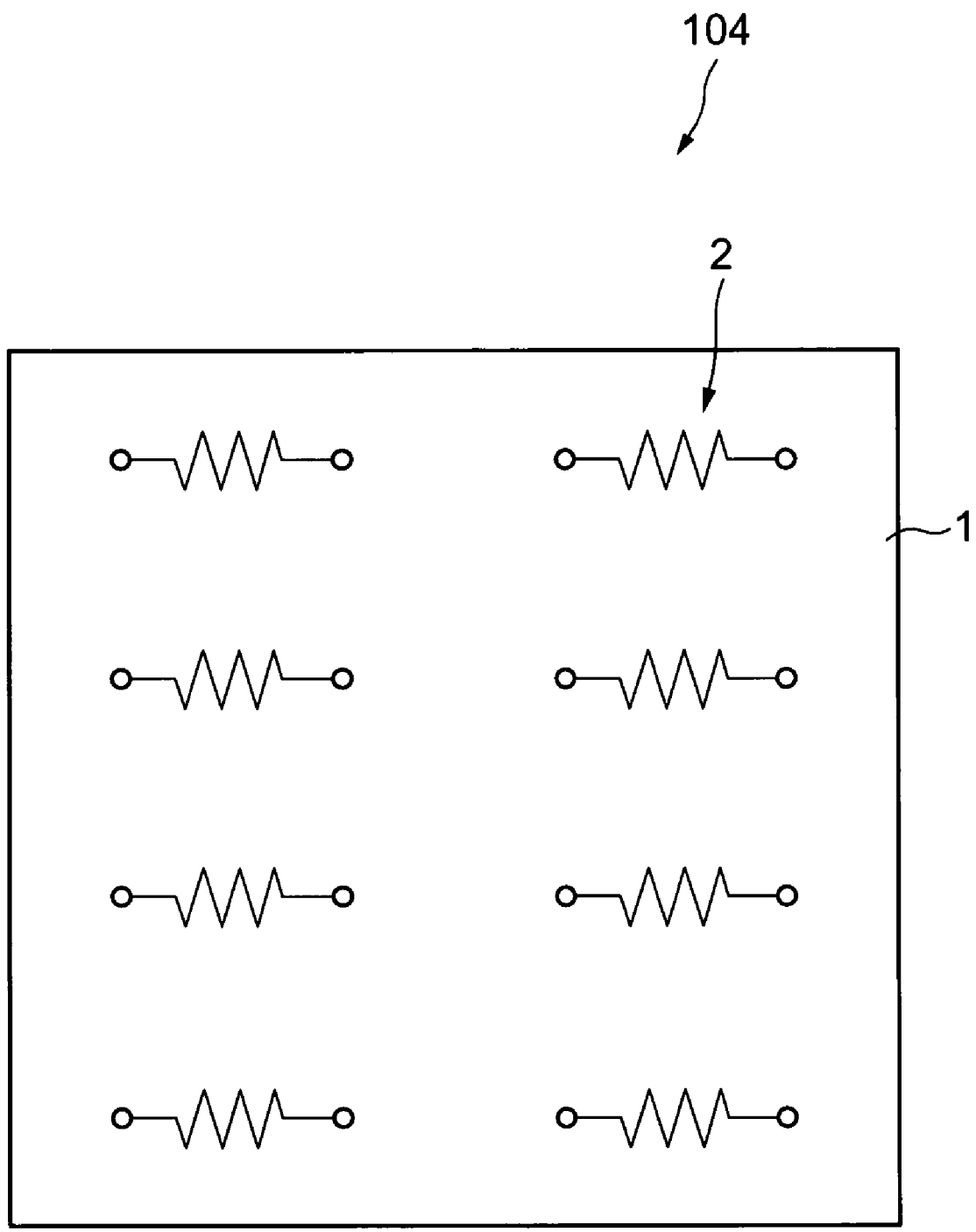
FIG. 18 is a plan view showing an equivalent circuit of a network electronic component according to a fifth embodiment of the invention.

FIG. 18 is a plan view showing the equivalent circuit of a network electronic component 104 according to the fifth embodiment of the invention. The network electronic component 104 differs from the network electronic component 100 of the first embodiment in that the network electronic component 104 has eight thin-film resistive elements 2 having a square shape in a plan view. The network electronic component 104 is acquired by dicing the silicon substrate 1 along every other vertical lines of dicing streets 23 shown in FIG. 4 and along every other horizontal lines of the dicing streets 23.

As apparent from the first, fourth and fifth embodiments, the identical wafered silicon substrate 1 shown in FIG. 4 can be diced in such a way that a diced unit contains a single network-electronic-component forming region 21 or two or four, i.e., even network-electronic-component forming regions 21, by merely changing the dicing position. Such dicing is possible as the thin-film resistors 3, the connection pads 4, the wirings 10, the columnar electrodes 11 and the solder balls 13 are formed at a time with respect to a plurality of network-electronic-component forming regions 21 on the wafered silicon substrate 1, and then the silicon substrate 1 is diced.

Sixth Embodiment

Figure 19:
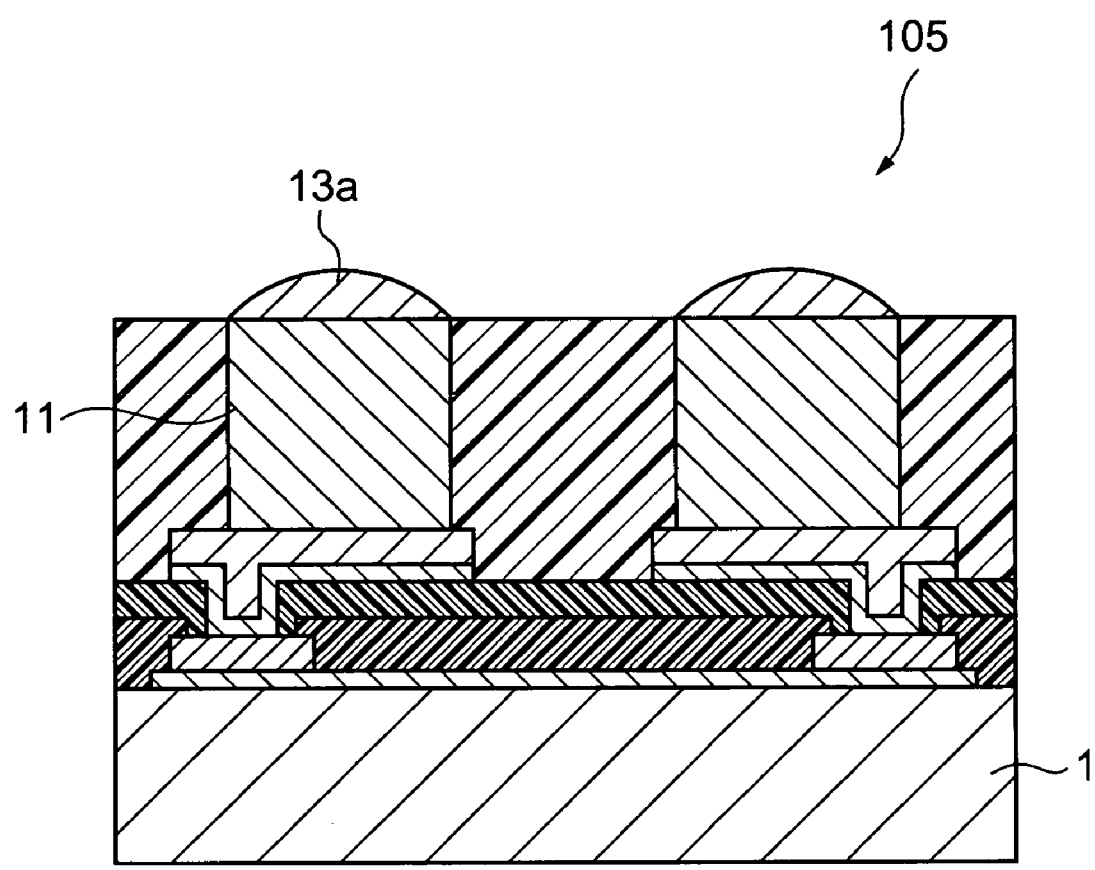
FIG. 19 is a cross-sectional view of a network electronic component according to a sixth embodiment of the invention.

FIG. 19 shows the cross section of a network electronic component 105 according to the sixth embodiment of the invention. The network electronic component 105 differs from the network electronic component 100 of the first embodiment shown in FIG. 3 in that a solder layer 13a is provided on the top side of the columnar electrode 11 instead of the solder ball 13.

Seventh Embodiment

Figure 20:
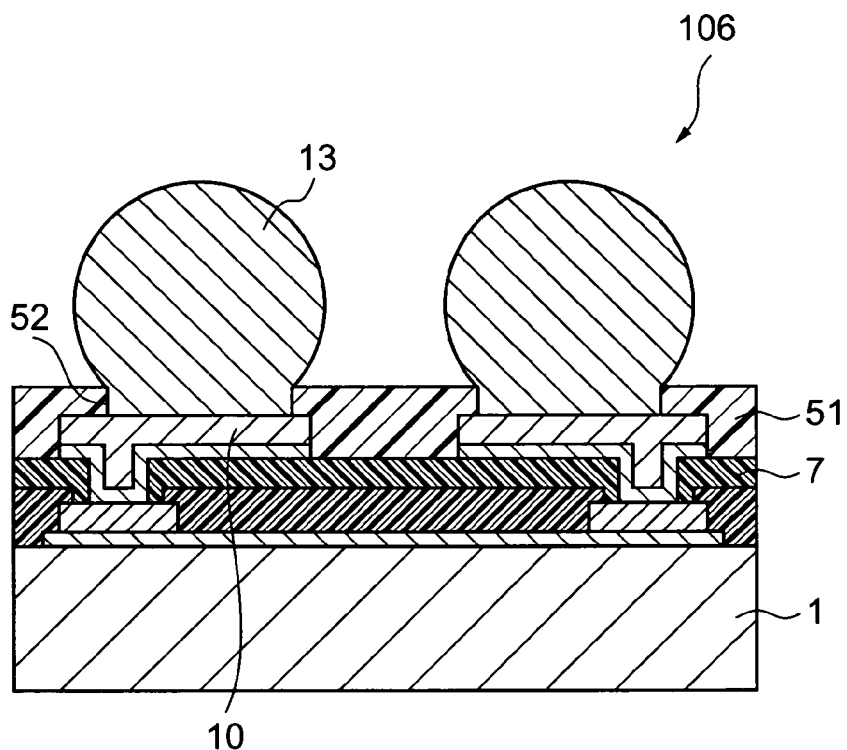
FIG. 20 is a cross-sectional view of a network electronic component according to a seventh embodiment of the invention.

FIG. 20 shows the cross section of a network electronic component 106 according to the seventh embodiment of the invention. The network electronic component 106 differs from the network electronic component 100 of the first embodiment shown in FIG. 3 in that the network electronic component 106 does not have the columnar electrode 11 and the sealing film 11, an overcoat film 51 comprised of a solder resist is provided on the top side of the protection film 7 including the wiring 10, and an opening 52 is provided at the overcoat film 51 on that portion of the wiring 10 which corresponds to the connection pad portion, and the solder ball is provided on the connection pad portion (external connection electrode) of the wiring 10 exposed through the opening 52.

Eighth Embodiment

Figure 21:
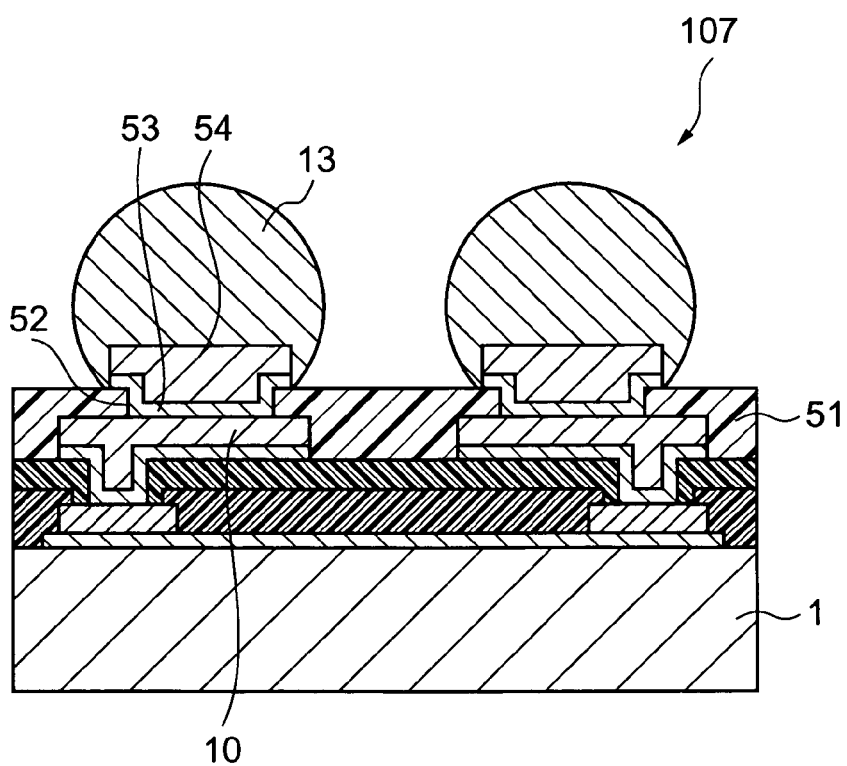
FIG. 21 is a cross-sectional view of a network electronic component according to an eighth embodiment of the invention.

FIG. 21 shows the cross section of a network electronic component 107 according to the eighth embodiment of the invention. The network electronic component 107 differs from the network electronic component 106 shown in FIG. 20 in that a base metal layer 53 of copper or the like and an upper connection pad (external connection electrode) 54 of copper are provided inside the opening 52 of the overcoat film 51 and on the top side of the overcoat film 51 near the opening 52 in such a way as to be in connection with the connection pad of the wiring 10, and the solder ball 13 is provided on an upper connection pad 54 including the base metal layer 53.

Because the invention has the external connection electrodes provided only on the substrate, as described above, a network electronic component with a simple structure can be provided. Further, the invention can simplify the manufacturing process for the network electronic component. Furthermore, the network electronic component of the invention, if connected to an integrated circuit element, can provide an inexpensive circuit substrate.

First Embodiment of Semiconductor Device

Recently, developments have been made on semiconductor devices having an integrated circuit element and a passive electronic component integrally packaged by designing a mobile apparatus typified by a notebook type personal computer or the like. Such a semiconductor device can be made considerably compact as compared with the prior art devices by using the network electronic component according to the invention. Embodiments of the semiconductor device will be described in detail.

Figure 22:
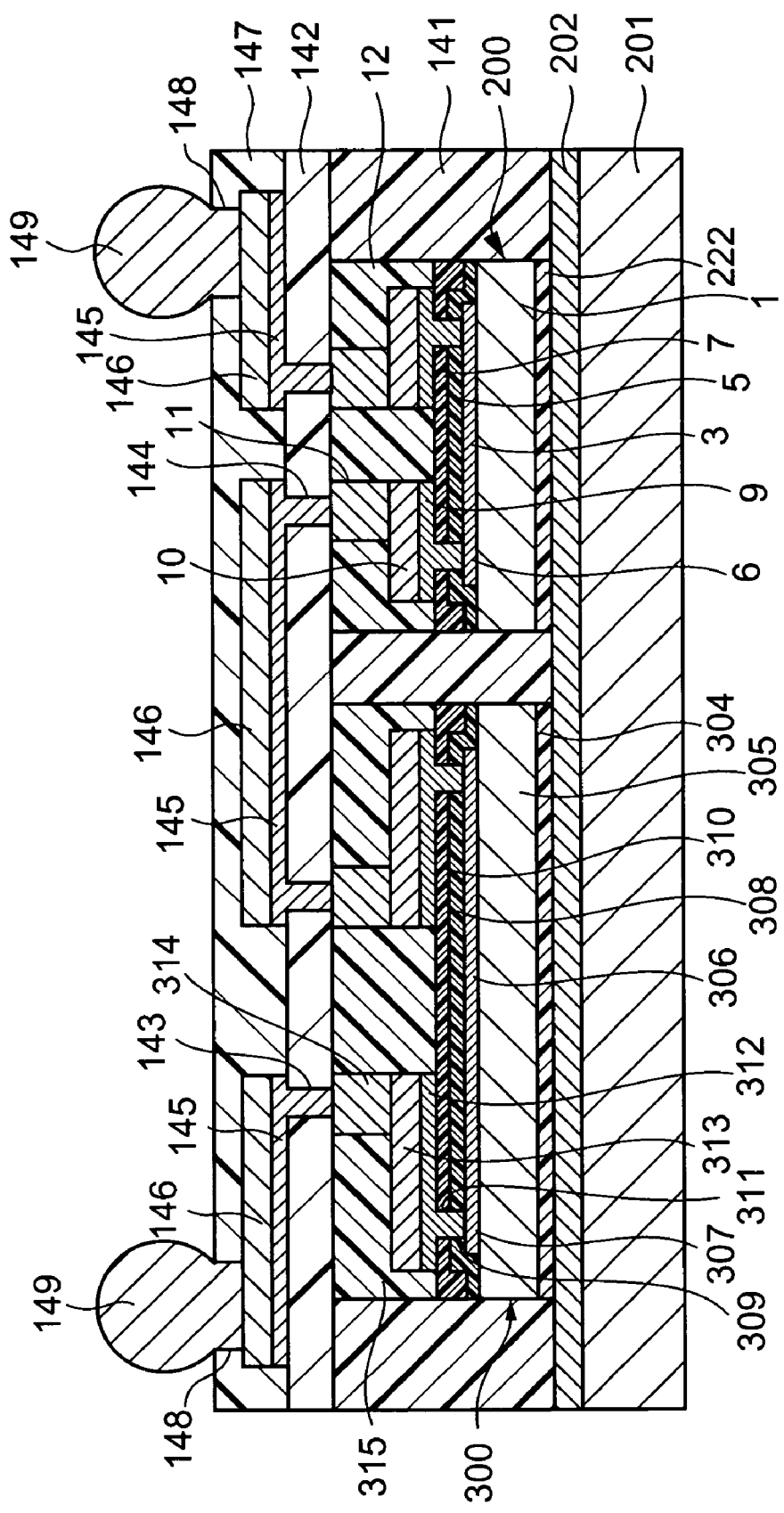
FIG. 22 is a cross-sectional view of a semiconductor device as a first embodiment, which has a passive element (network electronic component) of the invention.
Figure 23:
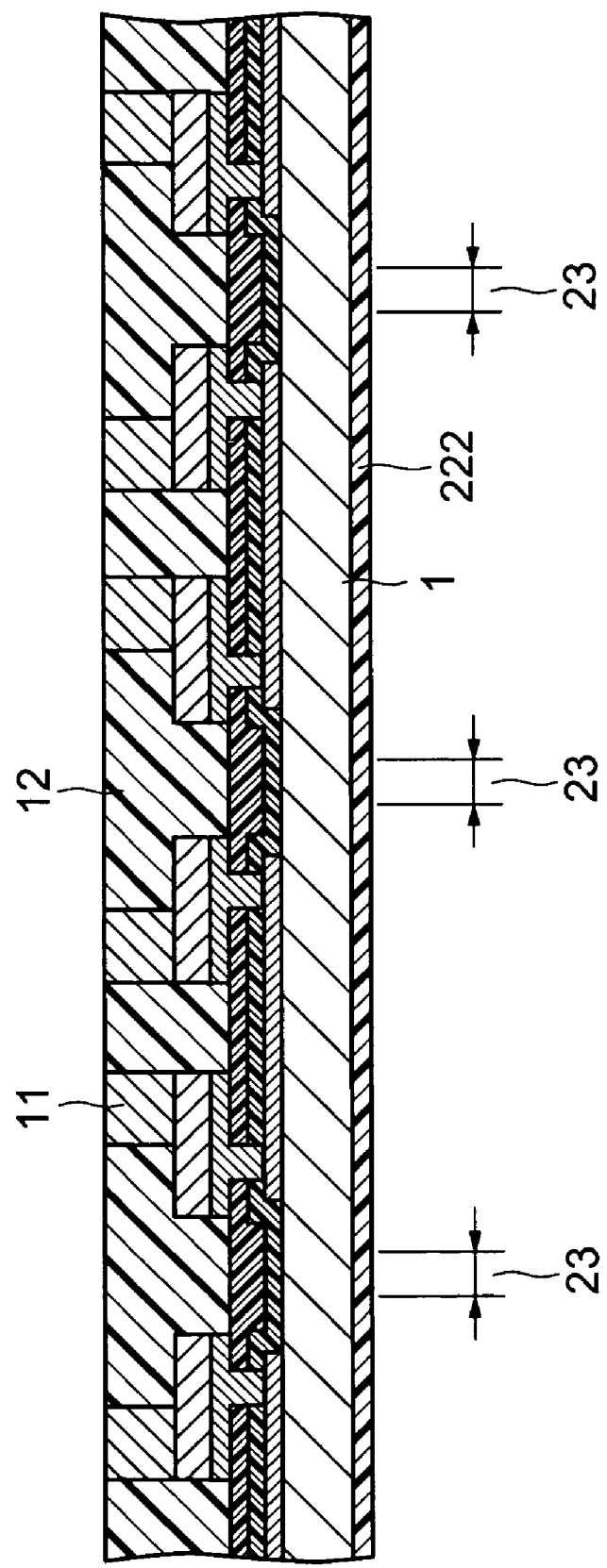
FIG. 23 is a cross-sectional view for explaining a manufacturing process for the passive element in FIG. 22.

FIG. 22 shows the cross section of a semiconductor device as a first embodiment, which has a network electronic component. This semiconductor device has a base plate 201 of epoxy base resin permeated into a glass fabric base or so having a square shape in a plan view. A ground layer 202 is formed of a copper foil and has a pattern formed on substantially the whole surface of the base plate 201. The bottom sides of a semiconductor element 300 with a square shape in a plan view and a passive element 200 with a square shape in a plan view are adhered to the top side of the ground layer 202 at predetermined locations by adhesive layers 304 and 222 comprised of a die bonding material.

To begin with the semiconductor element 300 will be discussed. The semiconductor element 300 has a wiring 313, a columnar electrode 314 and a sealing film 315, which will be discussed later, and is generally called "CSP" (Chip Size Package). As a method of acquiring individual semiconductor elements 300 by dicing after forming the wiring 313, the columnar electrode 314 and the sealing film 315 on a silicon wafer, the semiconductor element 300 is particularly called wafer level CSP (W-CSP). The structure of the semiconductor element 300 will be discussed below.

The semiconductor element 300 has a silicon substrate (semiconductor substrate) 305. The bottom side of the silicon substrate 305 is adhered to the top side of the ground layer 202 via the adhesive layer 304. The ground layer 202 serves to shield electric external noise and stabilize the electric potential. The ground layer 202 may or may not be electrically connected to the bottom sides of the silicon substrate 305 and the silicon substrate 1. Therefore, the adhesive layer 304 (and the adhesive layer 222 to be discussed later), formed of a die bonding material which is a non-conductive material, may be formed of a conductive material comprised of a silver paste or so.

The integrated circuit 306 having predetermined functions is provided in the center portion of the top side of the silicon substrate 305. A plurality of connection pads 307 (external connection electrodes) of an aluminum-based metal or the like are provided at the peripheral portion of the top side of the silicon substrate 305 in such a way as to be connected to the integrated circuit 306. An insulating film 308 of silicon oxide or the like is provided on the silicon substrate 305 and on the top side of the of that region of the integrated circuit 306 which excludes the center portion of the connection pad 307, and the center portion of the connection pad 307 is exposed through an opening 309 provided in the insulating film 308.

A protection film 310 of a polyimide resin, an epoxy resin or the like is provided on the top surface of the insulating film 308. An opening 311 is provided on the protection film 310 at that portion of the insulating film 308 which corresponds to the opening 308. A base metal layer 312 of copper or the like is provided on the top surface of the protection film 310. Wirings 313 of copper are provided on the on the entire top side of the base metal layer 312. One end of the wiring 313 including the base metal layer 312 is connected to the connection pad 307 via both openings 309 and 311.

A columnar electrode (external connection electrode) 314 of copper is provided on that top surface of the wiring 313 which corresponds to the connection pad. A sealing film 315 of an epoxy resin, a polyimide resin or the like is provided on the top surfaces of the wiring 313 and the protection film 310, with its top surface being in flush with the top surface of the columnar electrode 314. As apparent from the above, the semiconductor element 300 called W-CSP includes the silicon substrate 305, the integrated circuit 306, the connection pads 307, the insulating film 308, the protection film 310, the wirings 313, the columnar electrodes 314, and the sealing film 315.

The passive element 200 corresponds to each of the above-described network electronic components 100 to 107. Particularly, each of the network electronic components 100 and 105 has the columnar electrodes 11 and suitably corresponds to the semiconductor device of the embodiment. Of the network electronic components 100 to 107, the network electronic component 100 is adapted as one example in FIG. 22. The passive element 200 has the adhesive layer 222 at the back side of the silicon substrate 1 of the network electronic component 100, and is adhered to the top side of the ground layer 202 by the adhesive layer 222. The passive element 200 does not have a solder ball, and its columnar electrode 11 is an external connection electrode. The other structure of the passive element 200 is the same as that of the network electronic component 100, same reference symbols are given to the corresponding portions to avoid their otherwise redundant descriptions.

The passive element 200 basically differs from the semiconductor element 300 only in that the semiconductor element 300 has the integrated circuit 306 formed on the top side of the silicon substrate 305, whereas the passive element 200 has the thin-film resistor 3 formed on the top side of the silicon substrate 1, but both have the same structure in the height direction. And, the thickness of the thin-film resistor 3 of the passive element 200 is, for example, 0.1 to 0.4 µm, whereas the thickness of the integrated circuit 306 of the semiconductor element 300 from the top side of the silicon substrate 305 is 0.3 to 0.8 µm. Therefore, normally, the difference between the thicknesses of the thin-film resistor 3 and the integrated circuit 306 is merely 1 µm or less, which is not restrictive. As one example of the thickness (height) of the semiconductor element 300, the total thickness of the silicon substrate 305, the integrated circuit 306, the insulating film 308, the protection film 310, the base metal layer 312, and the wiring 313 is 200 to 350 µm. The height of the columnar electrode 314 is 60 to 150 µm. Therefore, the total size is 250 to 500 µm, so that the difference in thickness between the thin-film resistor 3 and the integrated circuit 306 is negligible. As apparent from the above, the passive element 200, like the semiconductor element 300, includes the silicon substrate 1, the connection pads 26, the insulating film 5, the protection film 7, the wirings 10, the columnar electrodes 11, and the sealing film 12.

As a result, that portion of the passive element 200 which excludes the thin-film resistor 3 can be formed by the same method as the one that forms that portion of the semiconductor element 300 which excludes the integrated circuit 306, and the height of the passive element 200 can be set nearly the same height as the semiconductor element 300. The invention is not limited to the case where the thickness of the semiconductor element 300 and the thickness of the passive element 200 are the same, but can also be suitably adapted when the difference between the thicknesses of the semiconductor element 300 and the passive element 200 is 50 µm or less.

The other structures of the semiconductor device shown in FIG. 22 will be discussed next. An insulating layer 141 is provided on the top side of the ground layer 202 around the semiconductor element 300 and the passive element 200 in such a way as to be approximately flush with the top sides of the semiconductor element 300 and the passive element 200. The insulating layer 141 is comprised of a thermosetting resin, such as an epoxy resin or a polyimide resin, or such a thermosetting resin with a reinforcing material, such as a silica filler, mixed therein.

An upper insulating film 142 with a flat top side is provided on the top sides of the semiconductor element 300, the passive element 200 and the insulating layer 141. The upper insulating film 142 is normally called "build-up material" which is used for a build-up substrate, and is formed of a thermosetting resin like an epoxy resin or so with a reinforcing material, such as a silica filler, mixed therein.

Openings 143 and 144 are provided at those portions of the upper insulating film 142 which correspond to the center portions of the top sides of the columnar electrodes 11 and 314. An upper base metal layer 145 of copper or the like is provided on the top side of the upper insulating film 142. An upper wiring 146 of copper is provided on the entire top side of the upper base metal layer 145. One end of the upper wiring 146 including the upper base metal layer 145 is connected to the top sides of the columnar electrodes 11 and 314 via the openings 143 and 144 of the upper insulating film 142. The columnar electrodes 11 which are connected to one end portions of the two thin-film resistors 3 of the passive element 200 are connected to predetermined two columnar electrodes 314 of the semiconductor element 300 via the upper wiring 146.

An overcoat film 147 comprised of a solder resist is provided on the top sides of the upper wiring 146 and the upper insulating film 142. An opening 148 is provided at that portion of the overcoat film 147 which corresponds to the connection pad portion of the upper wiring 146. A plurality of solder balls 149 are provided inside and above the openings 148 in such a way as to be connected to the connection pad portions of the upper wiring 146. The solder balls 149 are laid out in a matrix form on the connection pads of the upper wiring 146 exposed through the overcoat film 147. The columnar electrodes 11 which are connected to the other end portions of the two thin-film resistors 3 of the passive element 200 are connected to predetermined two solder balls 149 via the upper wiring 146.

According to the semiconductor device, as described above, the semiconductor element 300, which has the silicon substrate 305, the integrated circuit 306 formed on the silicon substrate 305, and the columnar electrodes 314 electrically connected to the integrated circuit 306, and the passive element 200, which has the silicon substrate 1, the thin-film resistor (thin-film passive element) 3 formed on the silicon substrate 1, and the columnar electrodes 11 electrically connected to the thin-film resistors 3, are provided on the base plate 201. As the passive element 200 is separate from the semiconductor element 300, the semiconductor device is given a general-purpose property by selecting the thin-film passive element.

One example of the method of manufacturing the semiconductor device will be described. The manufacturing method for the passive element 200 is as explained in the foregoing description of the network electronic component. From the view point of productivity, it is to more efficient to perform the step of adhering the adhesive layer 222 to the bottom side of the silicon substrate 1 before dicing of the silicon substrate 1. That is, it is preferable to expose the top side of the columnar electrode 33 and adhere the adhesive layer 222 to the entire bottom side of the silicon substrate 1 after planarizing the top side of the sealing film 12 including the exposed top side of the columnar electrode 11. The adhesive layer 222 formed of a die bonding material, such as an epoxy resin or polyimide resin, is firmly adhered, half cured, to the silicon substrate 1 by heating and pressing. Thereafter, the adhesive layer 222 firmly adhered to the bottom side of the silicon substrate 1 is adhered to a dicing tape (not shown), without mounting solder balls, and the silicon substrate 1, etc. are diced along the dicing streets 23 and separated from the dicing tape, thereby yielding a plurality of passive elements 200 each having the adhesive layer 222 at the bottom side of the silicon substrate 1, as shown in FIG. 22.

One example of the manufacturing method for the semiconductor element 300 will be discussed next. As mentioned above, the semiconductor element 300 and the passive element 200 differ from each other in that the semiconductor element 300 has the integrated circuit 306 formed on the top side of the silicon substrate 305, whereas the passive element 200 has the thin-film resistor 3 formed on the silicon substrate 1, but have the same structure in the height direction. Therefore, that portion of the semiconductor element 300 which excludes the integrated circuit 306 can be formed by the same method as the one that forms that portion of the passive element 200 which excludes the thin-film resistor 3.

Specifically, the integrated circuit 306, the connection pads 307, the insulating film 308, the protection film 310, the wiring 313 including the base metal layer 312, the columnar electrodes 314, the sealing film 315 and the adhesive layer 304 are formed at a time with respect to a plurality of semiconductor-element forming regions on the wafered silicon substrate 305. Thereafter, the resultant structure is diced along the dicing streets, yielding a plurality of semiconductor elements 300 each having an adhesive layer 204 at the bottom side of the silicon substrate 305. The height of the semiconductor element 300 is nearly the same as the height of the passive element 200.

Figure 24:
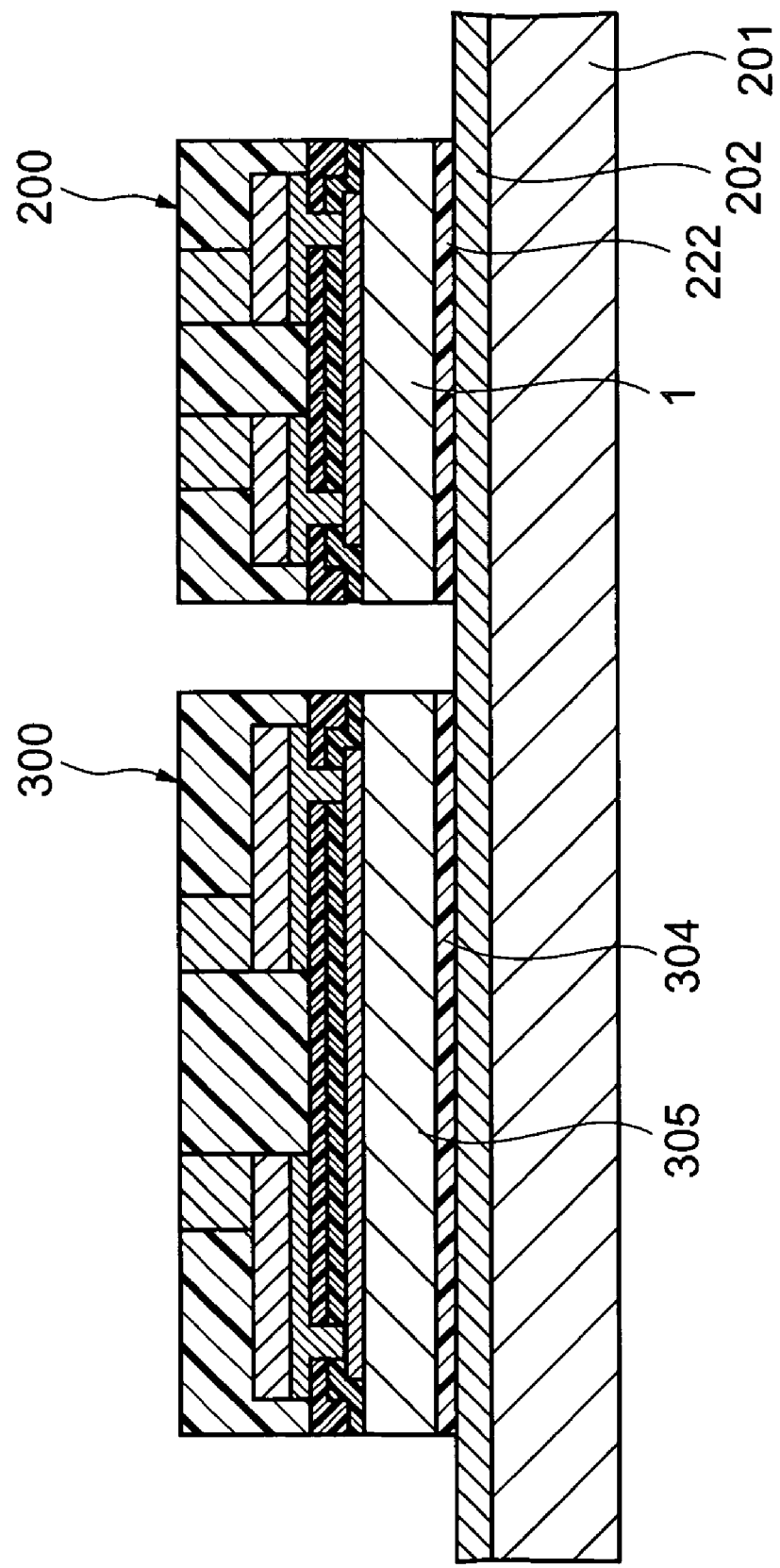
FIG. 24 is a cross-sectional view of a predetermined step in manufacturing the semiconductor device shown in FIG. 22.

The following will descried one example of manufacturing the semiconductor device as shown in FIG. 22 using the semiconductor element 300 and the passive element 200 acquired in the above manner. First, the base plate 201 having an area large enough to form a plurality of completed semiconductor devices shown in FIG. 22 is prepared as shown in FIG. 24. The base plate 201 has a square shape in a plan view, which is not restrictive. The ground layer 202 of a copper foil is laminated on the top side of the base plate 201.

Next, the adhesive layers 304 adhered to the bottom sides of the silicon substrates 305 of plural semiconductor elements 300 and the adhesive layers 222 adhered to the bottom sides of the silicon substrates 1 of plural passive elements 200 are adhered to predetermined respective locations on the top surface of the ground layer 202. The adhesion fully hardens the adhesive layers 304 and 222 by heating and pressing. Under the state, the top sides of the semiconductor element 300 and the passive element 200 are arranged on nearly the same horizontal plane.

Figure 25:
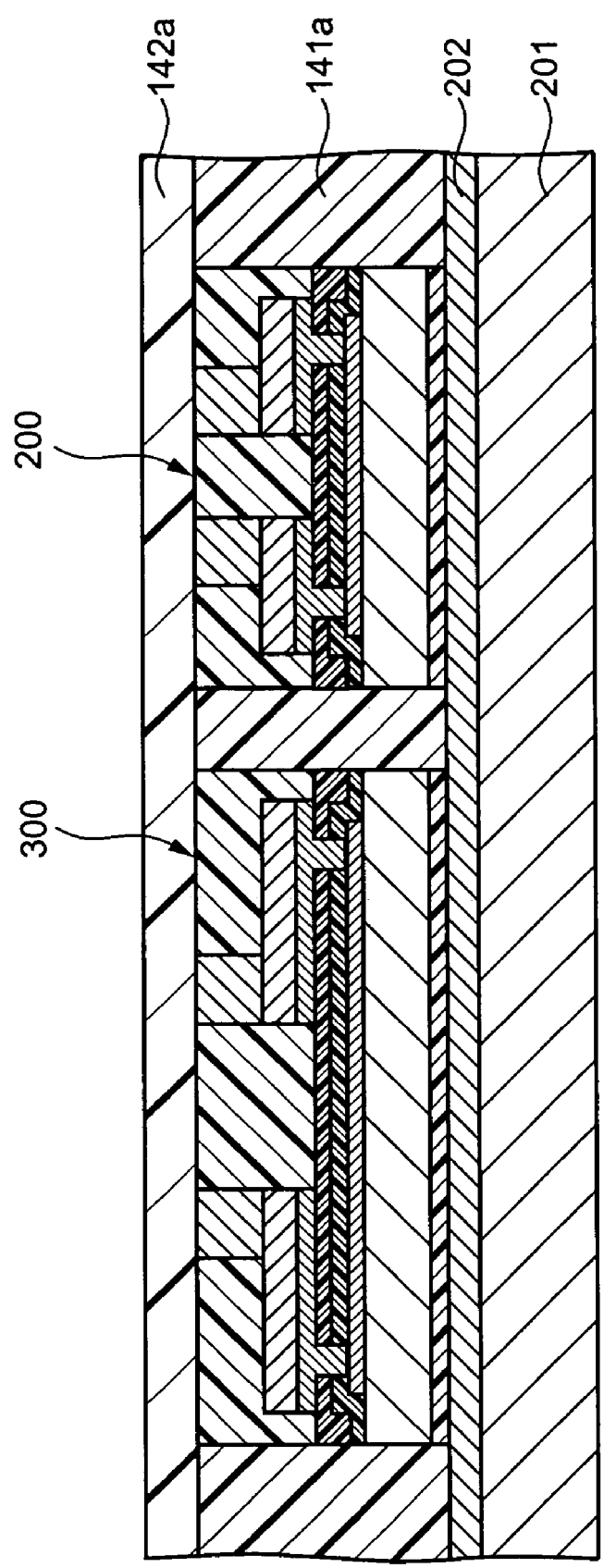
FIG. 25 is a cross-sectional view of a step following the step in FIG. 24.

Next, as shown in FIG. 25, an unhardened insulating layer 141a is formed on the top side of the ground layer 202 around the semiconductor element 300 and the passive element 200 by, for example, screen printing or spin coating. The unhardened insulating layer 141a is formed of, for example, a thermosetting resin, such as an epoxy resin or polyimide resin, or a thermosetting resin with a reinforcing material, such as a silica filler, mixed therein.

Next, a sheet-like unhardened upper insulating film 142a is laid out on the top sides of the semiconductor element 300, the passive element 200, and the unhardened insulating layer 141a. The unhardened upper insulating film 142a should preferably be a sheet-like build-up material, which is not restrictive. One example of the build-up material is a thermosetting resin, such as an epoxy resin or polyimide resin, half cured by mixing a silica filler into the thermosetting resin. A prepreg material obtained by impregnating glass fibers with a thermosetting resin, such as an epoxy resin, to make the thermosetting resin half cured, may be used, or a sheet-like thermosetting resin without a silica filler mixed therein may be used, as the unhardened upper insulating film 142a.

Figure 26:
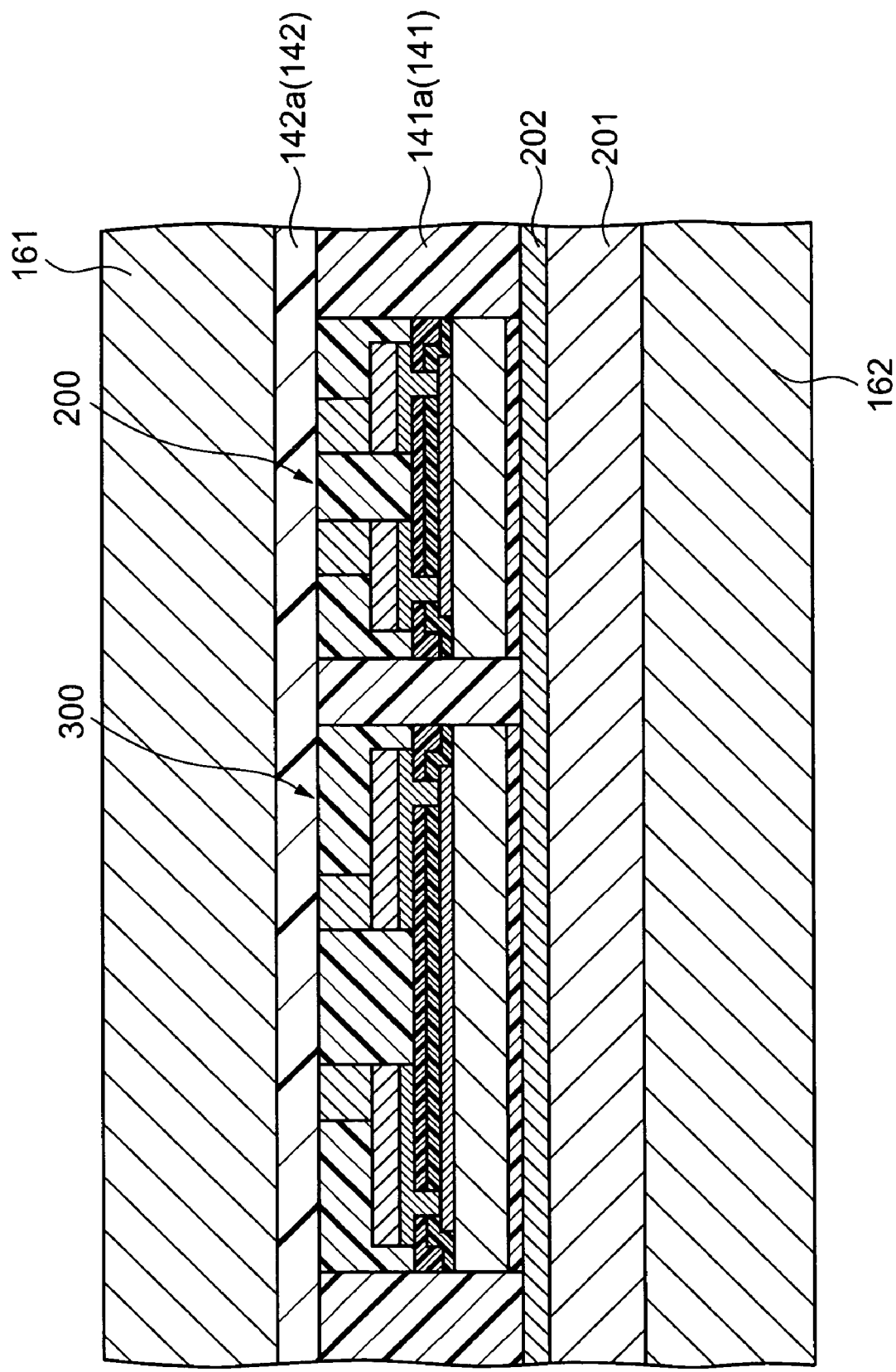
FIG. 26 is a cross-sectional view of a step following the step in FIG. 25.

Next, the unhardened insulating layer 141a and the unhardened (half-cured) upper insulating film 142a are heated and pressed to be hardened from the top and bottom by using a pair of heating/pressing plates 161 and 162, as shown in FIG. 26. As a result, the insulating layer 141 is formed on the top side of the ground layer 202 around the semiconductor element 300 and the unhardened insulating layer 141a, and the upper insulating film 142 is formed on the top sides of the semiconductor element 300, the passive element 200 and the insulating layer 141. As the top side of the upper insulating film 142 is pressed by the bottom side of the upper heating/ pressing plate 161, it becomes flat. This can eliminate the need for the polishing step to planarize the top side of the upper insulating film 142, which is not restrictive.

Because the semiconductor element 300 and the passive element 200 have approximately the same heights and their top sides are laid out on nearly the same horizontal planes, the top side of the upper insulating film 142 can be planarized easily and surely, and particularly, the thickness of the upper insulating film 142 on the semiconductor element 300 and the passive element 200 can be made approximately uniform both by using the sheet-like unhardened (half-cured) upper insulating film 142a comprised of a sheet-like build-up material or so for the upper insulating film 142 and merely heating and pressing the upper insulating film 142 from top and bottom using a pair of heating/pressing plates 161. When the difference between the thicknesses of the semiconductor element 300 and the passive element 200 is as large as several tens of micrometers, for example, the unhardened insulating layer 141a may also be formed not only around the semiconductor element 300 and the passive element 200 but on the top sides of the semiconductor element 300 and the passive element 200 in the state in FIG. 24, and may be set half cured, after which the unhardened insulating layer 141a on the top sides of the semiconductor element 300 and the passive element 200 may be polished together with the top sides of the columnar electrodes 11 and 314 in order to make the thicknesses of both the semiconductor element 300 and the passive element 200 uniform. Because the columnar electrodes 11 and 314 have heights of 60 to 150 μm, the top sides of the semiconductor element 300 and the passive element 200 can be planarized sufficiently if the difference between the thicknesses of the semiconductor element 300 and the passive element 200 is 50 μm or less. The upper insulating film 142 should be formed after planarization of the top sides of the semiconductor element 300 and the passive element 200 that way.

Figure 27:
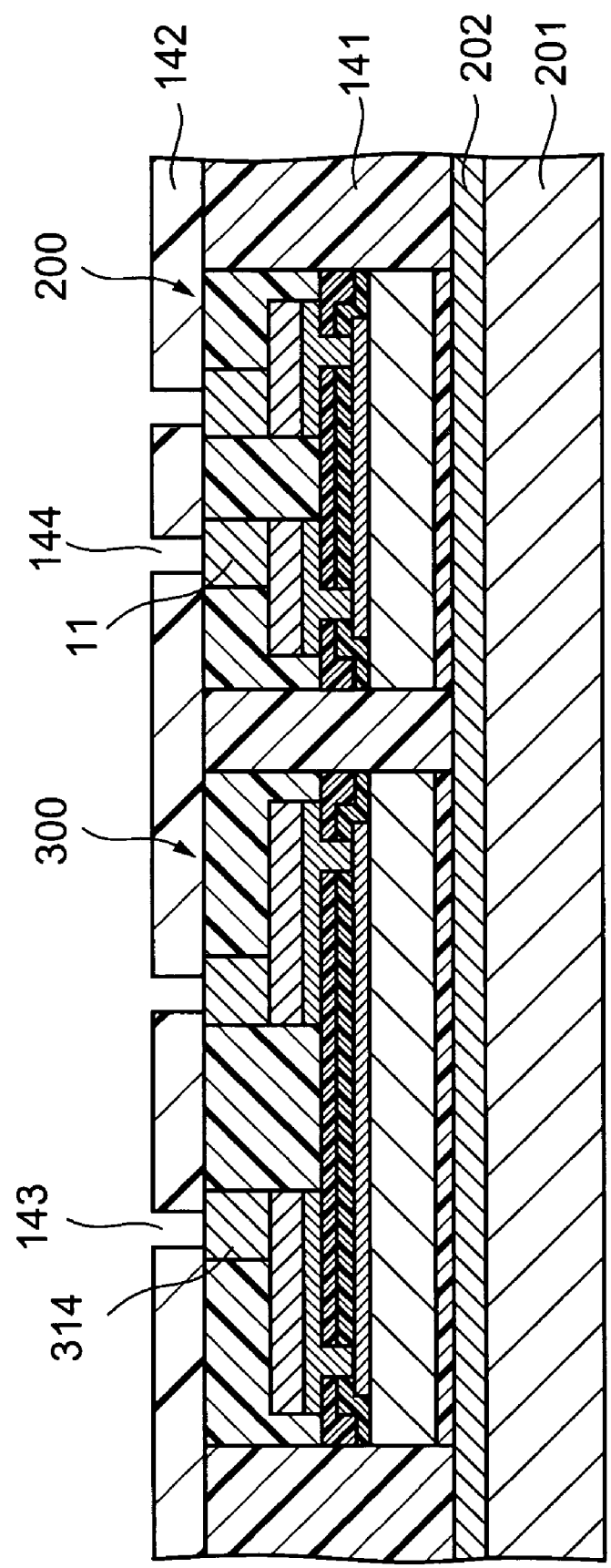
FIG. 27 is a cross-sectional view of a step following the step in FIG. 26.

Next, the openings 143 and 144 are formed in those portions of the upper insulating film 142 which correspond to the upper center portions of the columnar electrodes 11 and 314 by laser processing (or photolithography) which irradiates a laser beam, as shown in FIG. 27. The diameters of the columnar electrodes 11 and 314 are the same, while the diameters of the openings 143 and 144 are the same too. As the thickness of the upper insulating film 142 on the semiconductor element 300 is nearly equal to the thickness of the upper insulating film 142 on the passive element 200, the depths of the openings 143 and 144 are nearly equal to each other. This makes it possible to form the openings 143 and 144 at a time by the same laser processing. Next, epoxy smear or the like caused in the openings 143 and 144 is eliminated by a desmearing process.

Figure 28:
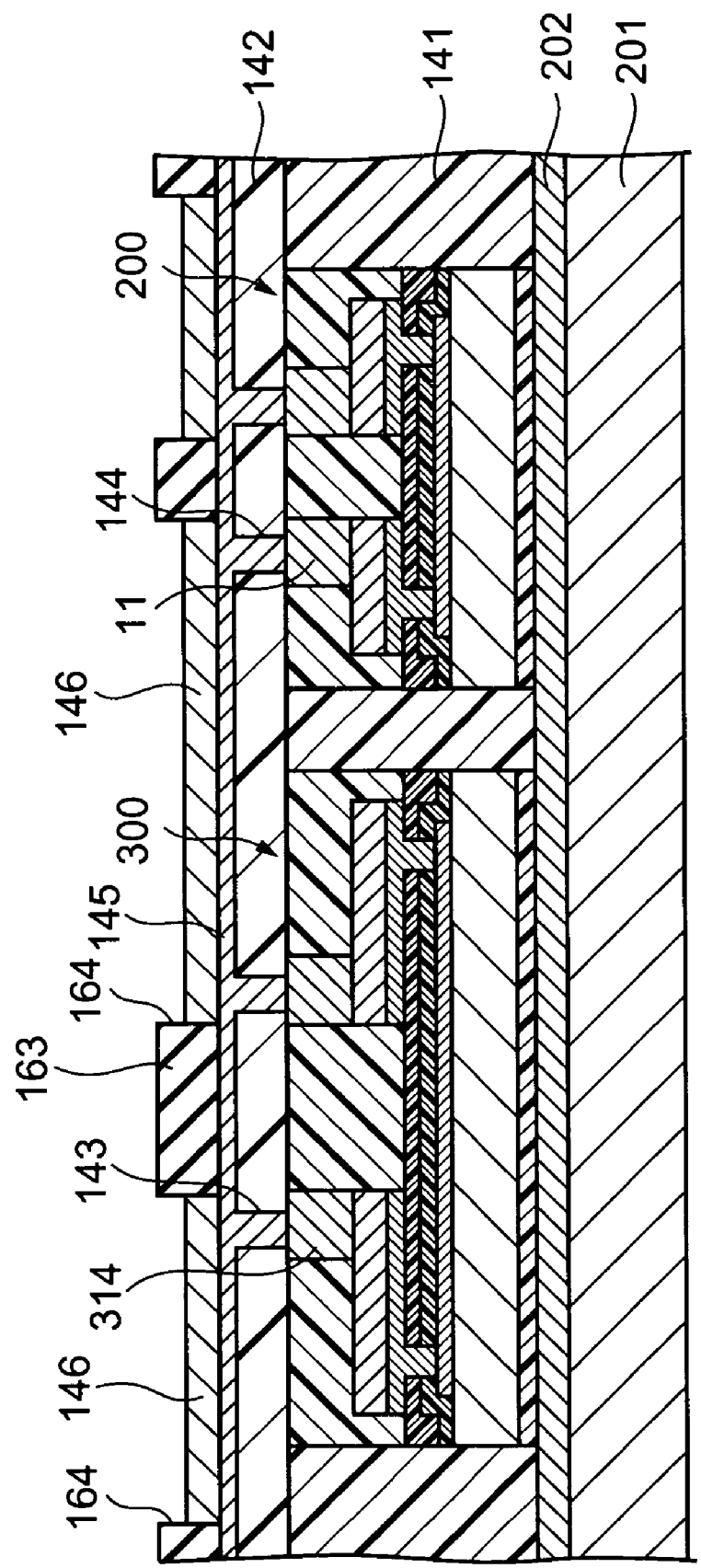
FIG. 28 is a cross-sectional view of a step following the step in FIG. 27.

Then, as shown in FIG. 28, the upper base metal layer 145 is formed on the entire top side of the upper insulating film 142 including the top sides of the columnar electrodes 11 and 314, exposed through the openings 143 and 144, by electroless plating of copper. Then, a plated resist film 163 is patterned on the top side of the upper base metal layer 145. An opening 164 is formed in that portion of the plated resist film 163 which corresponds to the upper-wiring forming region.

Figure 29:
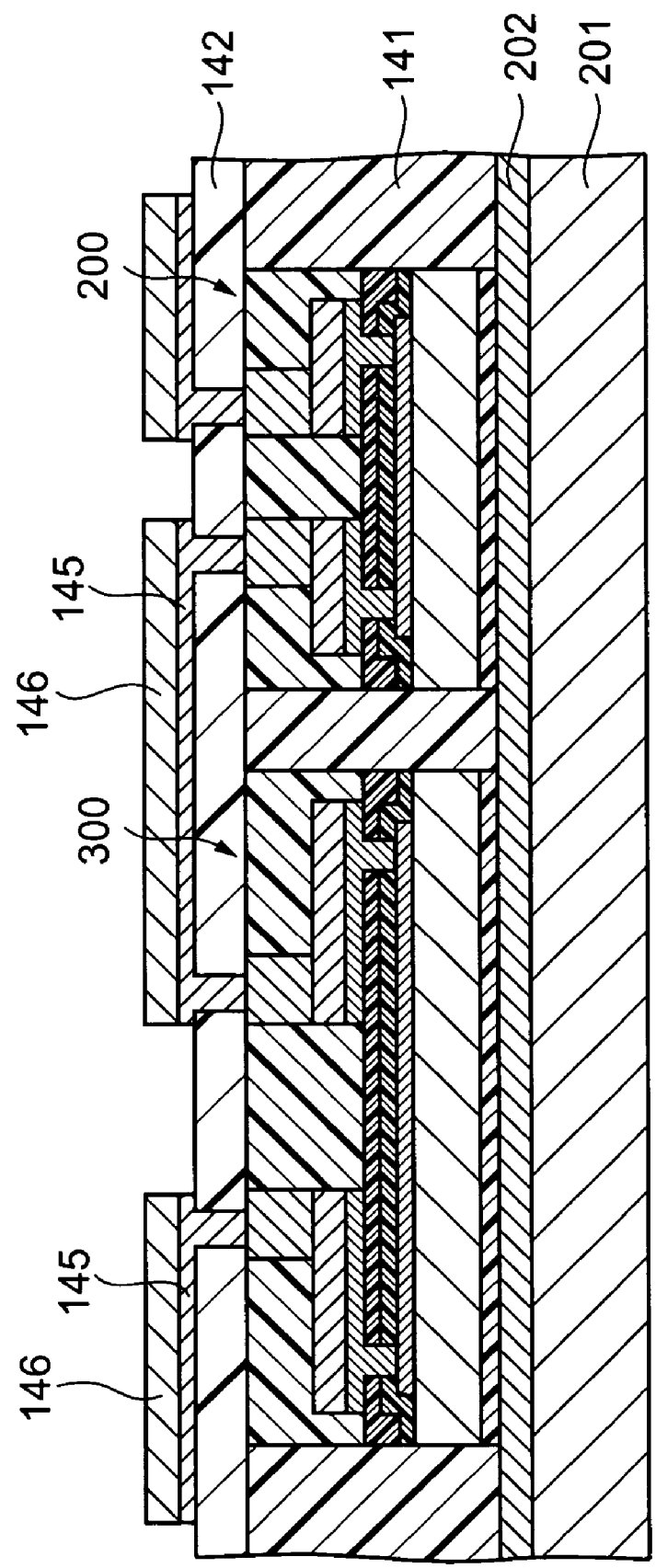
FIG. 29 is a cross-sectional view of a step following the step in FIG. 28.

Next, electroless plating of copper is performed with the upper base metal layer 145 as a plating current path, forming the upper wiring 146 on the top side of the upper base metal layer 145 inside the opening 164 of the plated resist film 163. Next, the plated resist film 163 is removed, then the unnecessary portions of the upper base metal layer 145 are etched out using the upper wiring 146 as a mask, leaving the upper base metal layer 145 only under the upper wiring 146 as shown in FIG. 29. As the upper wiring 146 including the upper base metal layer 145 is formed on the flat top side of the upper insulating film 142, the upper wiring 146 including the upper base metal layer 145 can be formed easily in such a manner as not to be easily short-circuited.

Figure 30:
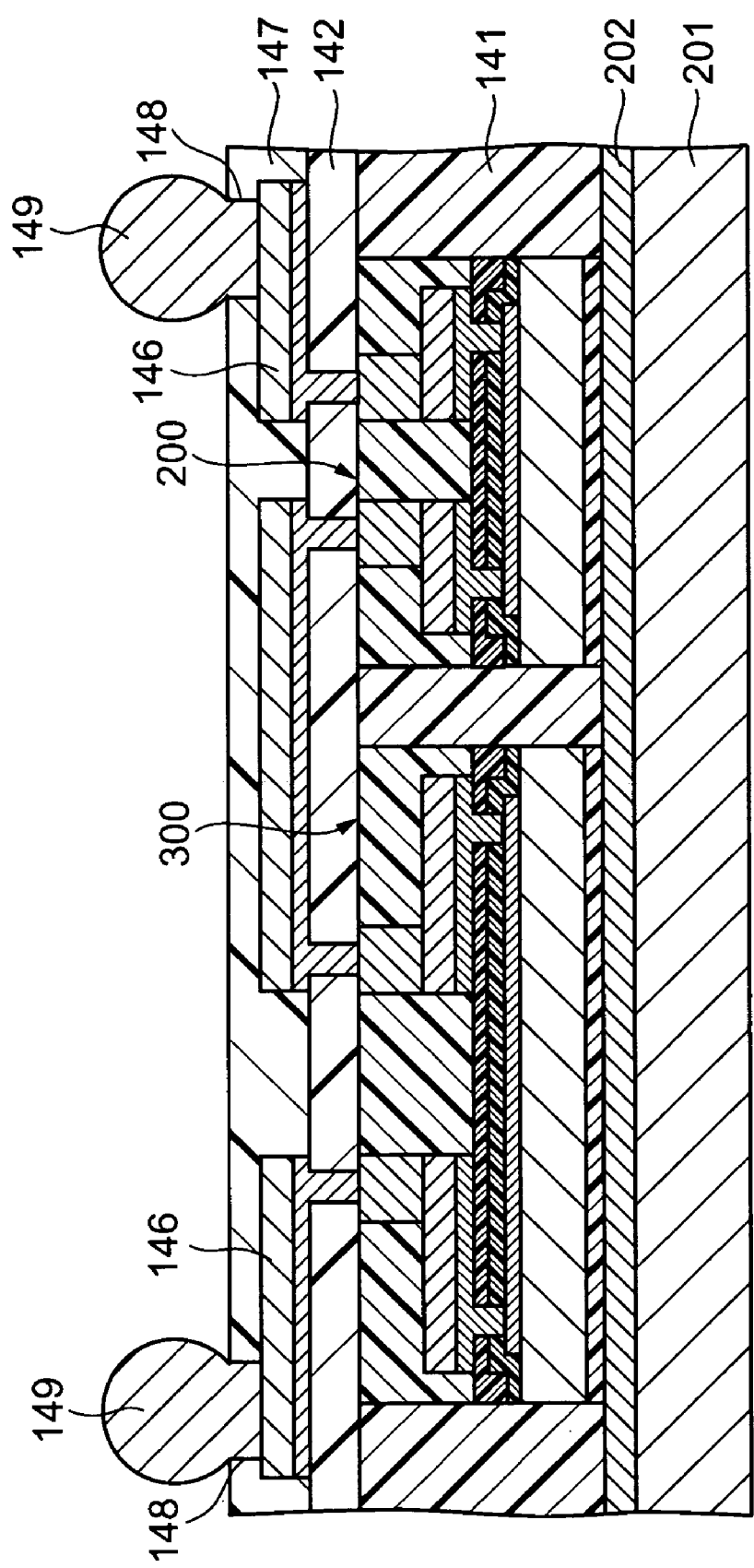
FIG. 30 is a cross-sectional view of a step following the step in FIG. 29.

Next, the overcoat film 147 comprised of a solder resist is formed on the top sides of the upper wiring 146 and the upper insulating film 142 by screen printing, spin coating or the like, as shown in FIG. 30. In this case, the opening 148 is formed at that portion of the overcoat film 147 which corresponds to the connection pad portion of the upper wiring 146. Then, the solder balls 149 are formed inside and above the openings 148 in such a way as to be connected to the connection pad portions of the upper wiring 146. Next, the overcoat film 147, the upper insulating film 142, the insulating layer 141, the ground layer 202 and the base plate 201 are cut at predetermined locations to provide a plurality of semiconductor devices shown in FIG. 22.

According to the manufacture method, as described above, the plural semiconductor elements 300 and the plural passive elements 200 are laid out on the ground layer 202 on the base plate 201 via the adhesive layers 304 and the 222, respectively, and the upper wiring 146 and the solder balls 149 are formed at a time with respect to the semiconductor elements 300 and the passive elements 200, after which the resultant structure is diced to yield a plurality of semiconductor devices. This method can simplify the manufacturing process. At and following the manufacturing step shown in FIG. 26, the semiconductor element 300 and the passive element 200 can be conveyed together with the base plate 201, which can also simplify the manufacturing process.

Second Embodiment of Semiconductor Device

Figure 31:
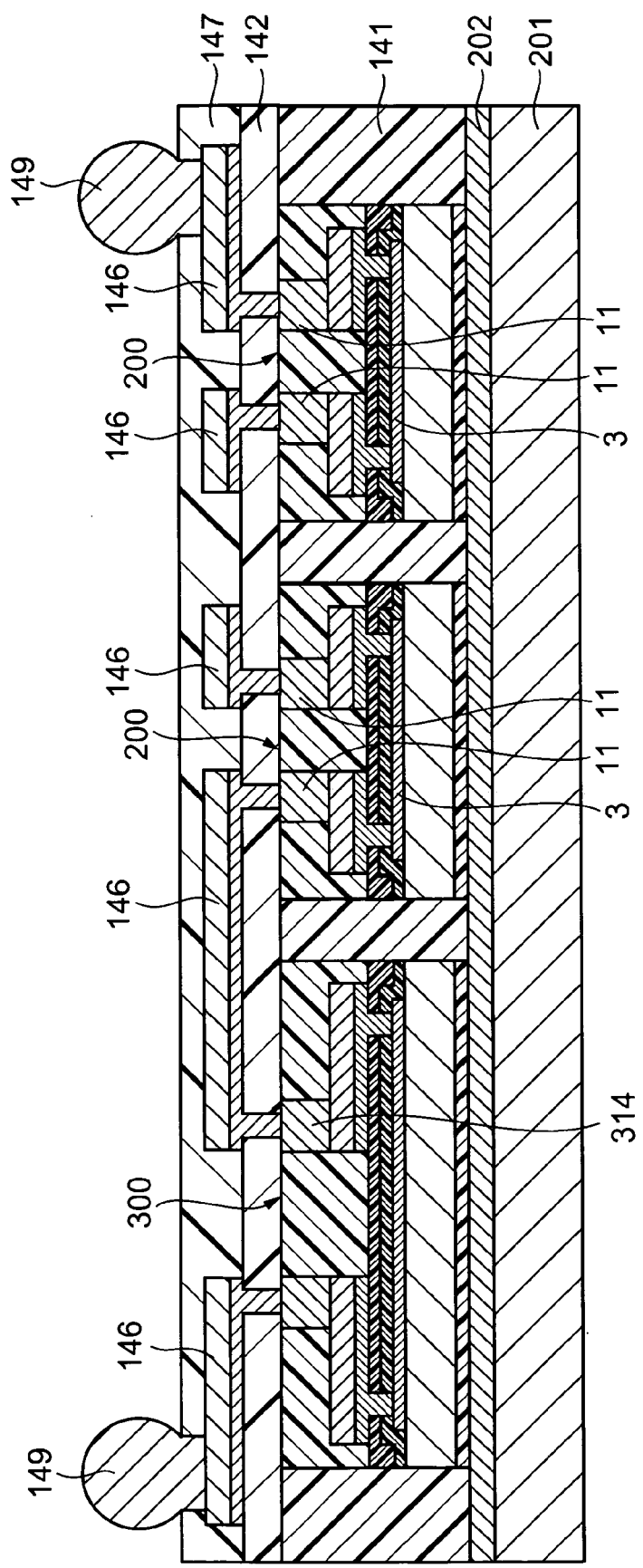
FIG. 31 is a cross-sectional view of a semiconductor device as a second embodiment, which has a passive element (network electronic component) of the invention.

FIG. 31 shows the cross section of a semiconductor device as the second embodiment of the invention. The semiconductor device differs from the semiconductor device shown in FIG. 22 in that two passive elements 200 are laid out on the ground layer 202 on the base plate 201. In this case, the columnar electrode 11 connected to one end portion of the plated resist film 23 of each passive element 200 is connected to the associated columnar electrode 314 of the semiconductor element 300 via the associated upper wiring 146, and the columnar electrode 11 connected to the other end portion of the thin-film resistor 3 is connected to the associated solder ball 149 via a predetermined upper wiring 146.

Third Embodiment of Semiconductor Device

Figure 32:
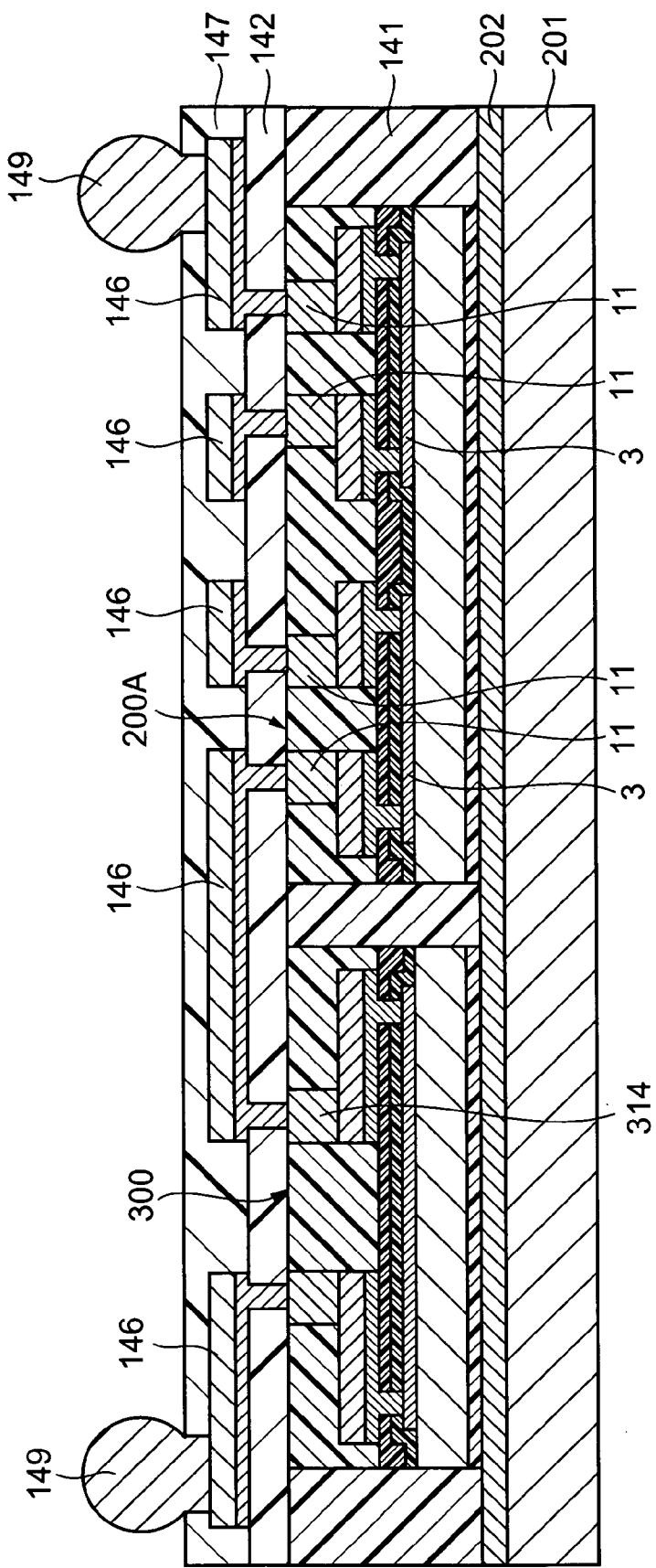
FIG. 32 is a cross-sectional view of a semiconductor device as a third embodiment, which has a passive element (network electronic component) of the invention.

FIG. 32 shows the cross section of a semiconductor device as the third embodiment of the invention. The semiconductor device differs from the semiconductor device shown in FIG. 31 in that a single passive element 200A having an integration of a plurality of network electronic components 100 shown in FIG. 3 is laid out on the ground layer 202 on the base plate 201. The passive element 200A corresponds to the network electronic component 103 or 104 as shown in FIG. 17 or FIG. 18.

The network electronic component 101 or 102 as shown in FIG. 13 or FIG. 16 can be replaced with the passive element 200 shown in FIG. 22, although the modification is not illustrated.

Fourth Embodiment of Semiconductor Device

Figure 33:
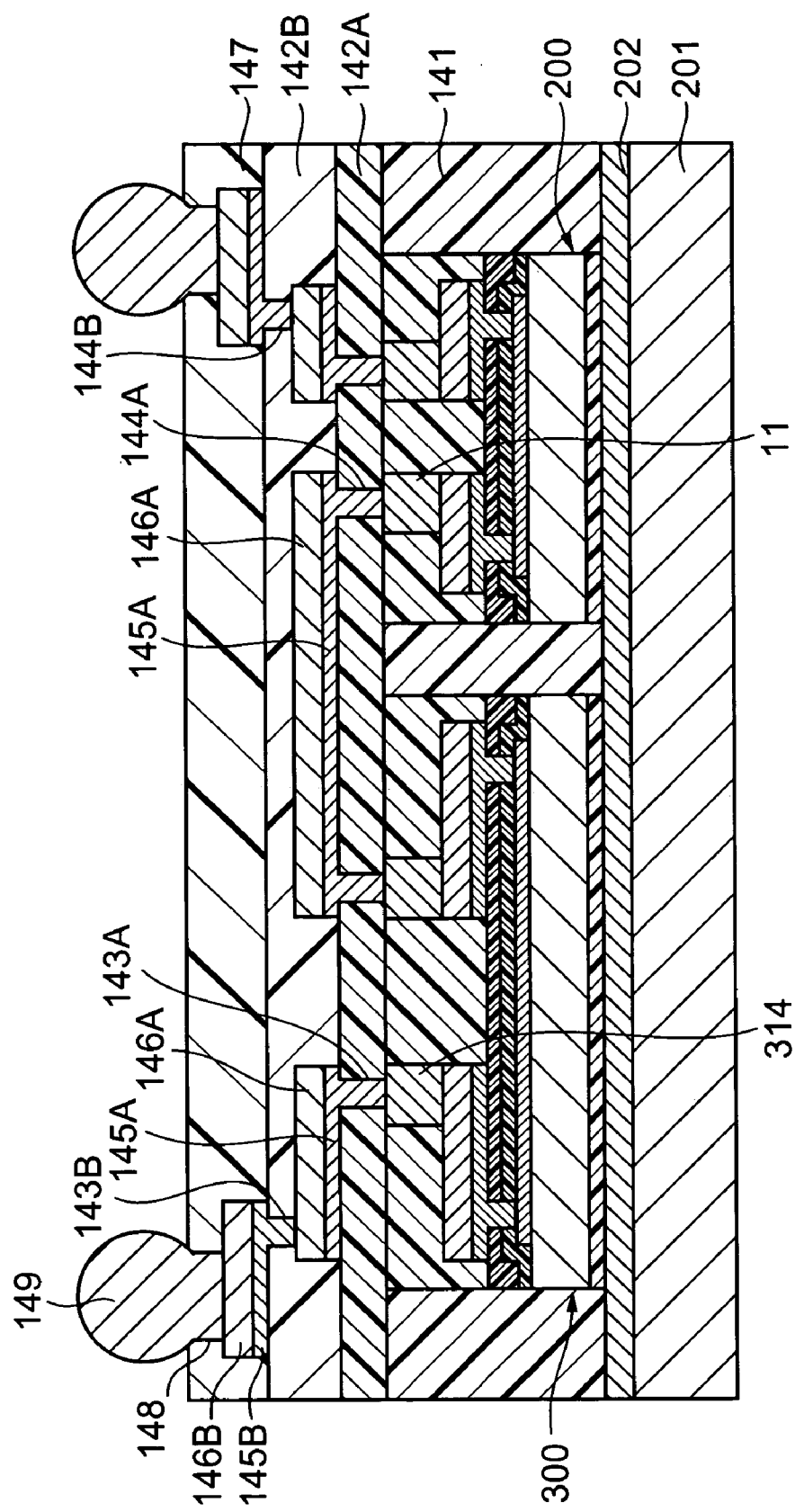
FIG. 33 is a cross-sectional view of a semiconductor device as a fourth embodiment, which has a passive element (network electronic component) of the invention.

FIG. 33 shows the cross section of a semiconductor device as the fourth embodiment of the invention. The semiconductor device significantly differs from the semiconductor device shown in FIG. 22 in that the upper insulating film and the upper wiring have a double-layer structure. Specifically, a second upper insulating film 142B of the same material as a first upper insulating film 142A is provided on the top sides of a first upper wiring 146A and the first upper insulating film 142A. A second upper base metal layer 145B and a second upper wiring 146B are provided on the top side of the second upper insulating film 142B.

One end portion of the first upper wiring 146A including a first upper base metal layer 145A is connected to the top sides of the columnar electrodes 11 and 314 via openings 143A and 144A of the first upper insulating film 142A. One end portion of the second upper wiring 146B including the second upper base metal layer 145B is connected to the connection pad portions of the first upper wiring 146A via openings 143B and 144B of the second upper insulating film 142B. The solder ball 149 is connected to the connection pad portion of the second upper wiring 146B via the opening 148 of overcoat film 147. The upper insulating film and the upper wiring may take a multi-layer structure having three or more layers.

Other Embodiments

In the step shown in FIG. 27, the method of forming the openings 143 and 144 in the upper insulating film 142 may be the photolithography technology. The diameters of the columnar electrodes 11 and 314 may differ from each other, and the diameters of the openings 143 and 144 may likewise differ from each other. For example, the diameters of the columnar electrode 11 and the opening 144 may be set smaller than those of the columnar electrode 11 and the opening 143.

The semiconductor element 300 may take such a structure where a thin-film passive element comprising one of a thin-film inductor, a thin-film SAW filter, a thin-film transformer, a micro strip line, and an MMIC (Microwave Monolithic Integrated Circuit) or the like is provided on the silicon substrate 305 having the integrated circuit 306 on the top side. In this case, in order for the passive element 200 to have nearly the same height as the semiconductor element 300, it is desirable that the passive element 200 should have nearly the same structure as the semiconductor element 300 by providing an interlayer insulating film and an intermediate wiring.

As external connection electrodes are provided only on the substrate according to the invention, the invention can take a simple structure and can simplify the manufacturing process.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2004-107800 filed on Mar. 31, 2004 and Japanese Patent Application No. 2004-289081 filed on Sep. 30, 2004 and including specification, claims, drawings and summary. The disclosures of the above Japanese Patent Applications are incorporated herein by reference in their entireties.

What is claimed is:

1. A semiconductor device comprising:
   a base plate;
   a semiconductor element which is provided on the base plate, and which comprises: a semiconductor substrate including an integrated circuit on a top side thereof and connection pads connected to the integrated circuit, an insulation layer formed on the semiconductor substrate and having openings at least partly exposing the connection pads, a plurality of wirings formed on the insulation layer and having first portions electrically connected with the connection pads and second portions disposed on a top surface of the insulation layer, a plurality of columnar external connection electrodes formed on the second portions of the wirings, and a sealing film provided between the external connection electrodes;
   a plurality of passive elements which are provided on the base plate and each of which comprises: a semiconductor substrate, a thin-film passive element having end portions and formed on the semiconductor substrate, an insulation layer formed on the thin-film passive element and the semiconductor substrate and having openings exposing the end portions of the thin-film passive element, a plurality of wirings formed on the insulation layer and having first portions electrically connected with the end portions of the thin-film passive element and second portions disposed on a top surface of the insulation layer, a plurality of columnar external connection electrodes formed on the second portions of the wirings, and a sealing film provided between the external connection electrodes;
   an insulating layer provided on the base plate around the semiconductor element and the passive elements, and between the semiconductor element and one of the passive elements adjacent to the semiconductor element;
   an insulating film which covers the semiconductor element, the passive elements, and the insulating layer;
   a plurality of upper wirings formed on the insulating film, the upper wirings comprising a first upper wiring which electrically connects at least one of the external connection electrodes of the semiconductor element and one of the external connection electrodes of the passive element nearest to the semiconductor element among the passive elements, a second upper wiring which is electrically connected to one of the columnar external connection electrodes of the semiconductor element, and a third upper wiring which is electrically connected to one of the columnar external connection electrodes of one of the passive elements; and
   a plurality of solder balls comprising a first solder ball which is electrically connected to the one of the columnar external connection electrodes of the semiconductor element and a second solder ball which is electrically connected to one of the columnar external connection electrodes of one of the passive elements.

2. The semiconductor device according to claim 1, wherein a periphery of the semiconductor substrate of the semiconductor element is coincident with a periphery of the insulation layer of the semiconductor element, and in each of the passive elements a periphery of the semiconductor substrate is coincident with a periphery of the insulation layer.

3. The semiconductor device according to claim 1, wherein a difference between a height of the semiconductor element and heights of the passive elements is equal to or less than 50 µm.

4. The semiconductor device according to claim 1, wherein a top surface of the sealing film of the semiconductor element, top surfaces of the sealing films of the passive elements, and a top surface of the insulating layer provided on the base plate around the semiconductor element and around the passive elements are flat.

5. The semiconductor device according to claim 4, wherein a top surface of the insulating film is flat.

6. The semiconductor device according to claim 1, wherein the thin-film passive element of one of the passive elements is a resistive element.

7. The semiconductor device according to claim 1, wherein the thin-film passive element of one of the passive elements is a capacitive element.

8. The semiconductor device according to claim 1, wherein the thin-film passive element of one of the passive elements is an RC element.

9. The semiconductor device according to claim 1, wherein a plurality of insulating films including an uppermost insulating film which have a lamination structure are provided, a plurality of wirings including an uppermost wiring which have a lamination structure are provided, and a connection pad portion is provided at the uppermost wiring.

10. The semiconductor device according to claim 9, further comprising an overcoat film which covers the uppermost insulating film and the uppermost wiring except for the connection pad portion.

11. The semiconductor device according to claim 10, wherein one of the solder balls is provided on the connection pad portion of the uppermost wiring.

12. The semiconductor device according to claim 1, further comprising a plurality of solder layers, including a solder layer on at least one of the external connection electrodes of the semiconductor element and a solder layer on at least one of the external connection electrodes of one of the passive elements.

* * * * *